(12) United States Patent
Aono et al.

(10) Patent No.: US 9,590,663 B2
(45) Date of Patent: Mar. 7, 2017

(54) RADIO APPARATUS

(71) Applicant: Hitachi, Ltd., Tokyo (JP)

(72) Inventors: Masahiro Aono, Tokyo (JP); Ken Takei, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 15/098,694

(22) Filed: Apr. 14, 2016

(65) Prior Publication Data

US 2016/0336973 A1    Nov. 17, 2016

(30) Foreign Application Priority Data

May 13, 2015   (JP) ................. 2015-097815

(51) Int. Cl.
  *H04K 1/02*     (2006.01)
  *H04L 25/03*    (2006.01)
  *H04L 25/49*    (2006.01)
  *H04B 1/04*     (2006.01)
  *H04L 27/20*    (2006.01)

(52) U.S. Cl.
  CPC .............. *H04B 1/04* (2013.01); *H04L 27/20* (2013.01); *H04B 2001/0408* (2013.01)

(58) Field of Classification Search
  CPC ......... H04L 27/12; H04L 27/10; H04L 27/04; H03C 3/14; H04B 2203/5466
  USPC ................... 375/242–254, 295–315
  See application file for complete search history.

(56) References Cited

U.S. PATENT DOCUMENTS

| | | | | |
|---|---|---|---|---|
| 4,567,602 A * | 1/1986 | Kato | ................... | H04L 27/2082 332/103 |
| 5,465,396 A * | 11/1995 | Hunsinger | ............. | H04H 20/30 375/232 |
| 5,534,827 A * | 7/1996 | Yamaji | ..................... | H03C 1/00 332/103 |
| 6,259,747 B1 * | 7/2001 | Gustafsson | ......... | H04L 27/2071 332/103 |
| 6,278,722 B1 * | 8/2001 | Evans | .................... | H04B 1/405 375/133 |
| 6,317,468 B1 * | 11/2001 | Meyer | .................... | H03B 28/00 375/269 |
| 6,546,044 B1 * | 4/2003 | Dent | ...................... | H04B 1/005 332/103 |
| 6,549,661 B1 * | 4/2003 | Mitsuyama | ........ | G06K 9/00127 356/39 |
| 6,809,669 B1 * | 10/2004 | Robinson | .................. | G06F 7/58 341/131 |
| 6,819,731 B1 * | 11/2004 | Nooralahiyan | ........... | H03J 7/18 375/377 |
| 6,822,595 B1 * | 11/2004 | Robinson | ................ | H03M 3/51 341/143 |

(Continued)

FOREIGN PATENT DOCUMENTS

| JP | 06-021991 A | 1/1994 |
|---|---|---|
| JP | 3419484 B | 6/2003 |
| JP | 2005-341240 A | 12/2005 |

*Primary Examiner* — James M Perez
(74) *Attorney, Agent, or Firm* — Mattingly & Malur, PC

(57) ABSTRACT

A radio apparatus includes a baseband signal generator to generate a baseband signal; a sine wave substituting device to substitute a transition part of the baseband signal in which a logic level switches from "0" to "1" or "1" to "0" with a sine wave represented with multi-values; and a delta sigma modulator to modulate the signal represented in the multi-values into a binary signal.

16 Claims, 17 Drawing Sheets

(56) References Cited

U.S. PATENT DOCUMENTS

| | | | | |
|---|---|---|---|---|
| 6,882,217 B1* | 4/2005 | Mueller | ............... | H03F 1/3241 330/149 |
| 7,164,662 B2* | 1/2007 | Preston | ............... | G01S 5/0027 370/328 |
| 7,733,980 B2* | 6/2010 | Beukema | ........... | H04L 27/0008 327/232 |
| 7,826,549 B1* | 11/2010 | Aggarwal | ............... | H03C 1/60 332/170 |
| 8,009,761 B2* | 8/2011 | Lai | ..................... | H04L 27/0008 375/273 |
| 8,054,924 B2* | 11/2011 | Madhavan | ......... | H04L 25/0214 375/328 |
| 8,189,646 B2* | 5/2012 | Ries | ....................... | G01S 19/02 375/140 |
| 8,229,009 B2* | 7/2012 | Moffatt | ................ | G06F 17/142 375/132 |
| 8,238,454 B2* | 8/2012 | Moffatt | ................ | G06F 17/142 375/132 |
| 8,249,129 B2* | 8/2012 | Fudge | ................. | H04B 1/7136 341/152 |
| 8,274,921 B2* | 9/2012 | Moffatt | ................ | G06F 17/142 370/260 |
| 8,358,717 B2* | 1/2013 | Park | .................... | H04L 27/2273 375/261 |
| 8,457,240 B2* | 6/2013 | Lee | ..................... | H04B 7/0417 375/285 |
| 8,774,315 B2* | 7/2014 | Cahn | ................... | H04B 1/707 375/274 |
| 9,014,624 B2* | 4/2015 | Manku | ................. | H04B 5/0062 455/41.1 |
| 9,088,319 B2* | 7/2015 | Peng | ................... | H04B 1/0475 |
| 2004/0176058 A1* | 9/2004 | Johnson | ................ | H03C 3/403 455/147 |
| 2004/0181497 A1* | 9/2004 | Dodgson | ................ | H04L 27/20 706/23 |
| 2004/0263365 A1* | 12/2004 | Robinson | ........... | H03M 7/3015 341/77 |
| 2005/0009488 A1* | 1/2005 | Lee | .................... | H04L 27/0002 455/232.1 |
| 2005/0013349 A1* | 1/2005 | Chae | ..................... | H04B 7/086 375/148 |
| 2005/0020313 A1* | 1/2005 | Chae | .................... | H04B 7/0854 455/562.1 |
| 2005/0110565 A1* | 5/2005 | Robinson | ................ | H03C 5/00 330/124 R |
| 2005/0118977 A1* | 6/2005 | Drogi | ....................... | H04B 1/40 455/323 |
| 2005/0266818 A1* | 12/2005 | Johnson | ................... | H03D 7/00 455/260 |
| 2006/0034391 A1* | 2/2006 | Belot | .................... | H04L 27/206 375/308 |
| 2006/0056536 A1* | 3/2006 | Hori | ....................... | H03F 1/3282 375/296 |
| 2006/0094376 A1* | 5/2006 | Lee | ....................... | H03F 1/0205 455/118 |
| 2006/0115005 A1* | 6/2006 | Hickling | .................. | H03C 3/40 375/247 |
| 2006/0119493 A1* | 6/2006 | Tal | ...................... | H03M 7/3017 341/143 |
| 2006/0153309 A1* | 7/2006 | Tang | ................... | H04L 27/2608 375/260 |
| 2006/0246861 A1* | 11/2006 | Dosanjh | .................. | H03B 21/00 455/147 |
| 2007/0092024 A1* | 4/2007 | Madhavan | .......... | H04L 27/2071 375/283 |
| 2007/0160164 A1* | 7/2007 | Sahota | ..................... | H03C 5/00 375/295 |
| 2007/0258398 A1* | 11/2007 | Chesnutt | ............. | H04L 27/2071 370/328 |
| 2008/0026717 A1* | 1/2008 | Huynh | ................. | H04B 1/0007 455/266 |
| 2008/0068240 A1* | 3/2008 | Matsuura | ................ | H03M 3/51 341/143 |
| 2009/0207939 A1* | 8/2009 | Mertens | .................. | H03F 3/195 375/297 |
| 2010/0205510 A1* | 8/2010 | von der Embse | .... | G06F 17/148 714/776 |
| 2012/0243637 A1* | 9/2012 | Sorrells | ..................... | H03C 5/00 375/297 |
| 2012/0257670 A1* | 10/2012 | Nagatani | ............... | H03F 1/0227 375/238 |
| 2013/0194114 A1* | 8/2013 | Ritter | .................... | H03M 3/368 341/110 |
| 2013/0300619 A1* | 11/2013 | Manku | .................. | G01S 13/756 343/750 |
| 2013/0324033 A1* | 12/2013 | Manku | .................. | H04B 5/0062 455/41.1 |
| 2015/0263813 A1* | 9/2015 | Gorshtein | .......... | H04B 10/6166 398/115 |
| 2015/0381242 A1* | 12/2015 | Takei | ....................... | H04B 7/10 375/260 |
| 2015/0381401 A1* | 12/2015 | Butterfield | ............ | H03F 1/0205 375/295 |
| 2016/0255499 A1* | 9/2016 | Takei | ....................... | H04K 1/08 |

\* cited by examiner

RADIO APPARATUS

CROSS REFERENCE TO RELATED APPLICATION

This application claims the benefit of foreign priority to Japanese Patent Application No. JP2015-097815, filed May 13, 2015, which is incorporated by reference in its entirety.

BACKGROUND OF THE INVENTION

1. Field of the Invention

The present invention relates to a radio apparatus.

2. Description of the Related Art

Japanese patent No. 3419484 and JP 2005-341240 A discloses background art in the field of the invention.

Japanese patent No. 3419484 discloses a modulator including a signal converting means responsive to a modulation signal for conversion to have a digital selection signal which becomes an predetermined analog signal when time averaging is made and a selecting means for selecting one of signals having different phases or amplitudes with the same frequency on the basis of the selection signal to output the selected one.

JP 2005-341240 A discloses a technology of radio apparatus in the abstract as follows:

A lower harmonic wave removal device 20 supplied with a baseband signal and a reference clock signal having a period shorter than the period of the baseband signal outputs a voltage which is derived by approximating a sine wave synchronizing with the reference clock signal in accordance with variation in codes in the baseband signal. The analog filter 22 removes harmonic components from the output signal of the lower harmonic wave removal device.

However, in Japanese patent No. 3419484 and JP 2005-341240 A, there are problems as follows:

Japanese patent No. 3419484 disclosed a method of limiting a band of the baseband signal with a ΔΣ modulator.

In this method, it is impossible to stop frequency components near the carrier frequency. Accordingly there is a problem in that a circuit scale becomes large because it is necessary to add filters for restricting adjacent channel leakage power.

JP 2005-341240 A discloses a method of removing high frequency components of the baseband signal using analog switches. However, this method requires amplitude modulation and analog switches are necessary outside the digital circuit. Accordingly, there is a problem in that the circuit scale becomes large.

SUMMARY OF THE INVENTION

The present invention is provided in consideration of the above-described problems to provide a radio apparatus for band limitation on a small circuit scale.

An aspect of the present invention provides a radio apparatus comprising:

a baseband signal generator to generate a baseband signal;

a sine wave substituting device to substitute a transition part of the baseband signal having a logic level switching from "0" to "1" or "1" to "0" with a multivalue signal of sine wave; and a delta sigma modulator to modulate the multivalue signal into a binary signal.

An aspect of the present invention provides a radio apparatus providing band limitation of the baseband signal on a small circuit scale.

BRIEF DESCRIPTION OF THE DRAWINGS

The object and features of the present invention will become more readily apparent from the following detailed description taken in conjunction with the accompanying drawings in which.

The same or corresponding elements or parts are designated with like references throughout the drawings.

DETAILED DESCRIPTION OF THE INVENTION

Hereinafter, embodiments are described with reference to drawings. The same or corresponding parts are designated with the same or like reference throughout the specification and a duplicated explanation are omitted.

First Embodiment

An example of the radio communicator in which a baseband signal is subject to a band limitation without any external additional filter is described as a radio apparatus according to a first embodiment of the present invention. A radio frequency band used in this embodiment is 420 MHz band as a radio frequency band and a signal of 4 kHz is used for the baseband signal.

Figure 1:
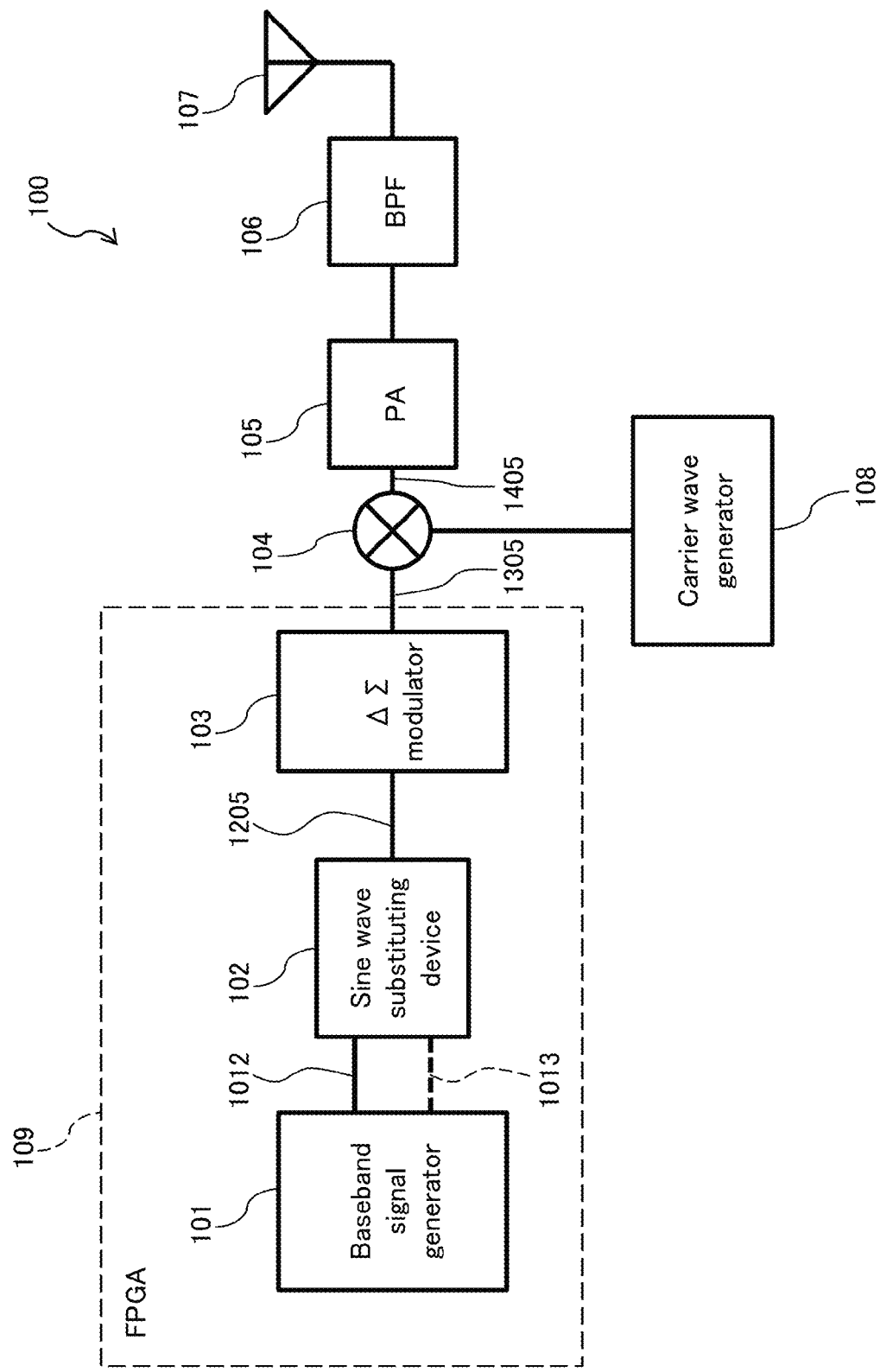
FIG. 1 is a block diagram showing an example of a transmitter as a radio apparatus according to a first embodiment of the present invention.

FIG. 1 is a block diagram illustrating an example of a transmitter 100 as a radio apparatus according to the first embodiment of the present invention.

In FIG. 1, a baseband signal 1012 for transmission is generated by a baseband signal generator 101.

The baseband signal 1012 generated by the baseband signal generator 101 is applied to a sine wave substituting device 102. In addition, baseband frequency information 1013 is also applied to the sine wave substituting device 102 from the baseband signal generator 101.

The sine wave substituting device 102 substitutes a transition part from "1", or High to zero (or Low) of the baseband signal 1012 and a transition part from "0" to "1" with a multivalue sine waves (for example eight bits of sine wave). In the former case, the signal is substituted with a sine wave in a range from π/2 to 3π/2 (π/2 to −π/2) and the latter is substituted into a sine wave in a range from 3π/2 to π/2 (−π/2 to π/2).

The reason for substitution of the baseband signal 1012 in being transition from a state of zero to a state of 1 or from the state of zero to the state of 1, is in reduction in high frequency components (noise source) in being transition state.

Functions and operation of the sine wave substituting device 102 is described in detail later because the functions and a configuration of a sine wave substituting device 102 are largely characterized portion in the first embodiment.

A signal 1205 undergone substitution by the sine wave substituting device 102 is inputted into a delta sigma modulator 103 (ΔΣ modulating part, ΔΣ modulating circuit). The delta sigma modulator 103 modulates the multivalue (for example, 8 bits) signal 1205 undergone the substitution into a binary signal (one bit) again.

Configuration and operation of the delta sigma modulator 103 are described later again.

The baseband signal generator 101, a sine wave substituting device 102, and a delta sigma modulator 103 described above are all installed in an FPGA (Field Programmable Gate Array) 109 as digital circuit.

An output of the delta sigma modulator 103 is outputted by the FPGA 109 using a digital signal standard such as LVDS (Low voltage differential signaling).

A baseband signal 1305 outputted by the FPGA 109 is multiplied by a carrier wave generated by a carrier wave generator 108 with a multiplier 104 (carrier wave modulator).

The carrier wave generator 108 and the multiplier 104 can modulate the carrier by BASK (Binary Phase Shift Keying) to include the baseband signal 1305 in the carrier.

In other words, the multiplier 104 has a function of a carrier wave modulator for modulating the carrier wave of the carrier wave generator 108 with the baseband signal 1305 of the output of the delta sigma modulator 103.

The carrier wave generator 108 is configured using a circuit such as a PLL (Phase Locked Loop).

The signal of the carrier wave modulated by the multiplier (carrier wave modulator) 104 is amplified by a power amplifier (PA) 105 and band-limited by a band-pass filter (BPF) 106, and transmitted by an antenna (transmission antenna) 107 as an electromagnetic wave.

The multiplier 104, the carrier wave generator 108, the power amplifier 105, and the band-pass filter 106 in FIG. 1 are all analog circuits. On the other hand, circuits in the FPGA 109 are all formed with digital circuits.

In addition, because harmonic waves of the baseband signal are sufficiently reduced, the band-pass filter 106 is allowed only to limit radiation outside the band.

Hereinafter, the sine wave substituting device 102 is described in detail as follows:

<Details in the Sine Wave Substituting Device>

The sine wave substituting device 102 has been described about general function and configuration. Because the use of the sine wave substituting device 102 is a large feature of the first embodiment, the configuration and operation are described below.

Figure 2:
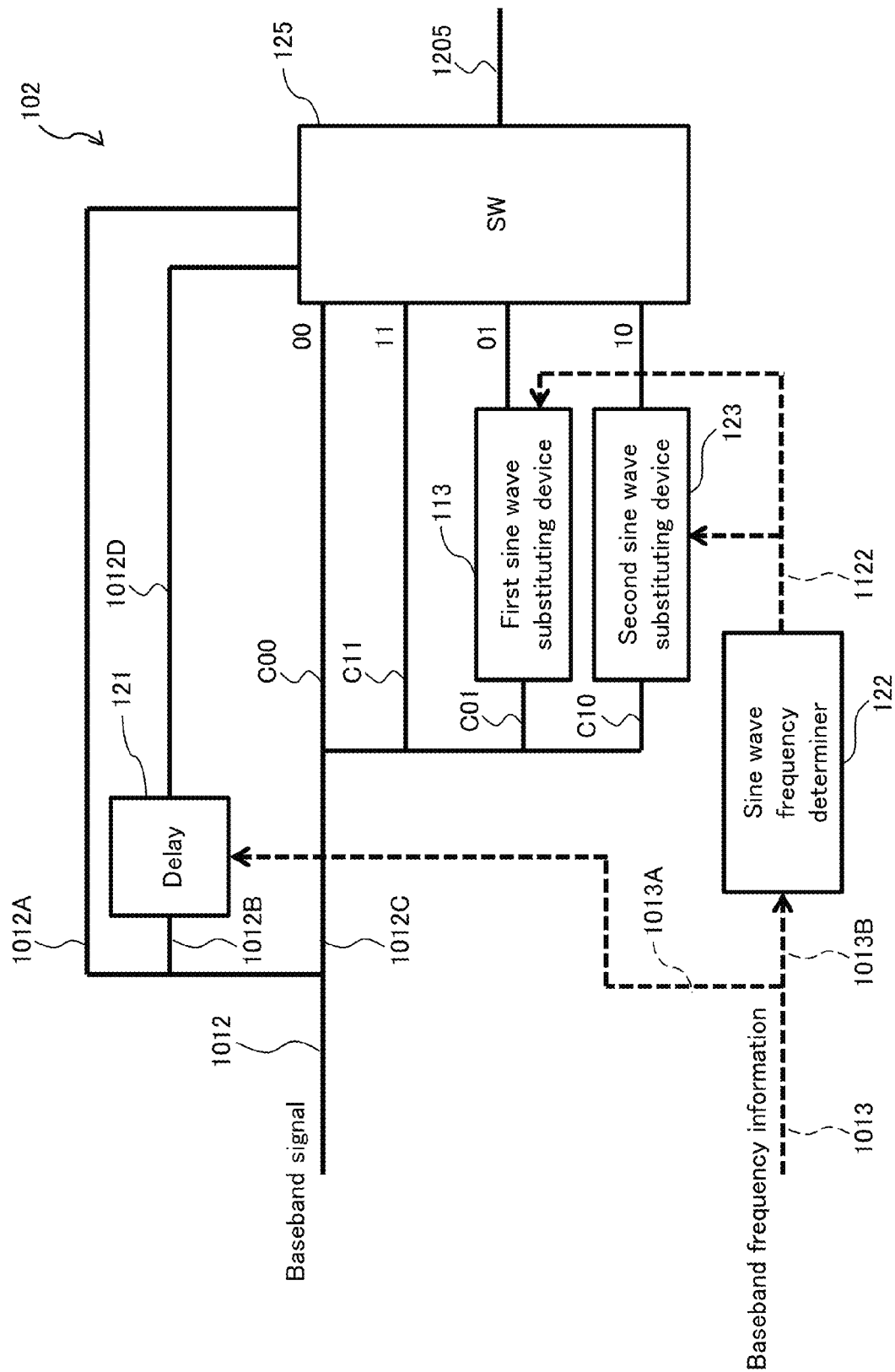
FIG. 2 is a block diagram illustrating an example of a sine wave substituting device according to the first embodiment of the present invention.

FIG. 2 is a block diagram illustrating an example of the sine wave substituting device 102 according to the first embodiment of the present invention.

In FIG. 2, the sine wave substituting device 102 is configured including a first sine wave substituting device 113, the second sine wave substituting device 123, a sine wave frequency determiner 122, a delay 121, and a switch (SW) 125.

Further, the sine wave substituting device 102 is supplied with the baseband signal 1012 and the baseband frequency information 1013.

The baseband signal 1012 inputted into the sine wave substituting device 102 is divided into three signals 1012A, 1012B, 1012C first.

The signal 1012A is inputted as a first switching signal into the switch (SW) 125 as it is.

The signal 1012B is delayed by one cycle of the baseband with the delay 121 and the delayed signal as a signal 1012D is inputted into the switch 125 as a second switching signal.

The signal 1012C is further divided into four signals C00, C11, C01, and C10.

Two signals C00, C11 out of the four signals C00, C11, C01, and C10 are directly inputted into the switch 125 directly.

Figure 4:
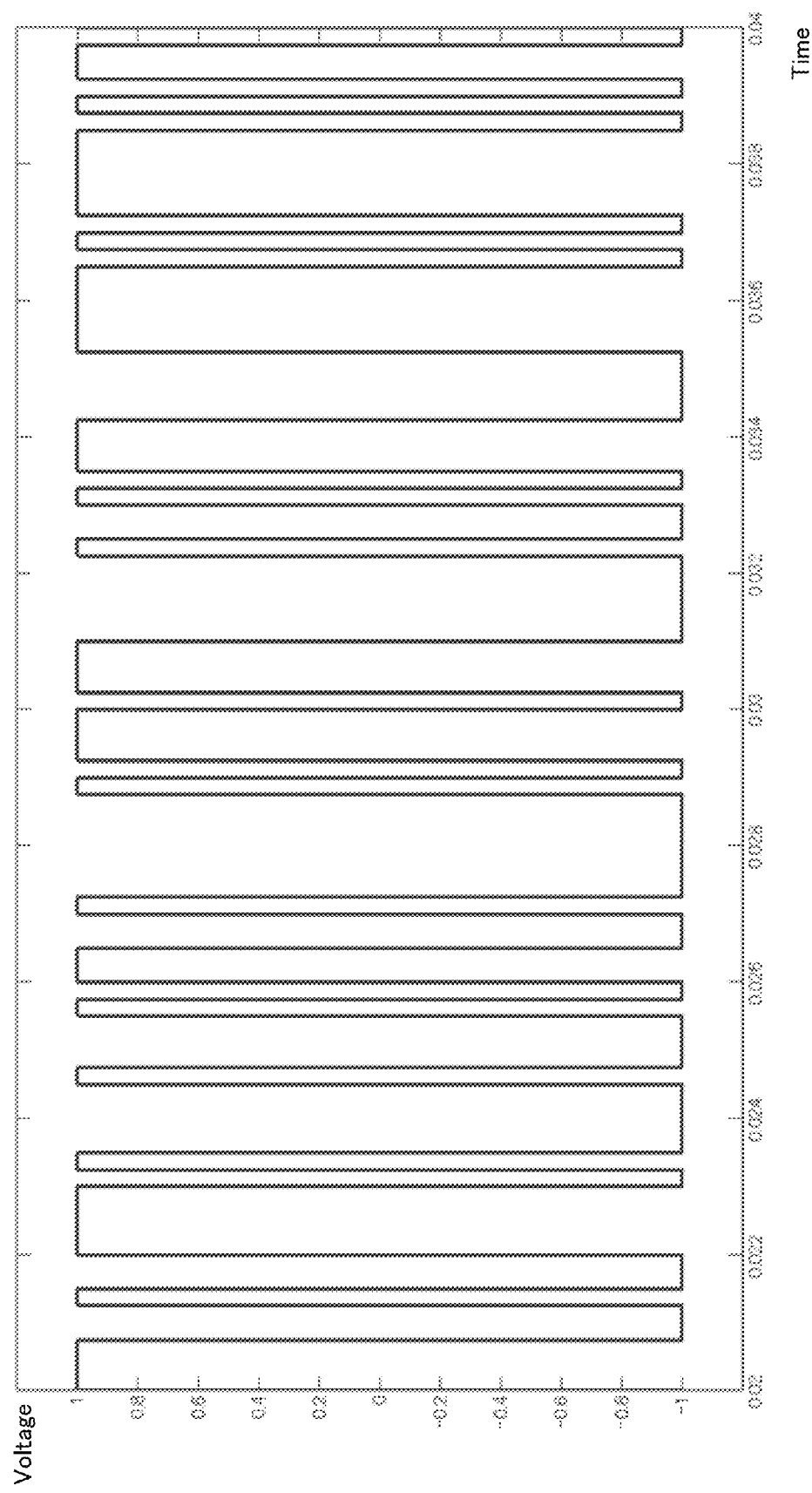
FIG. 4 shows a waveform of a baseband signal generated by the baseband signal generator according to the first embodiment of the present invention.
Figure 5:
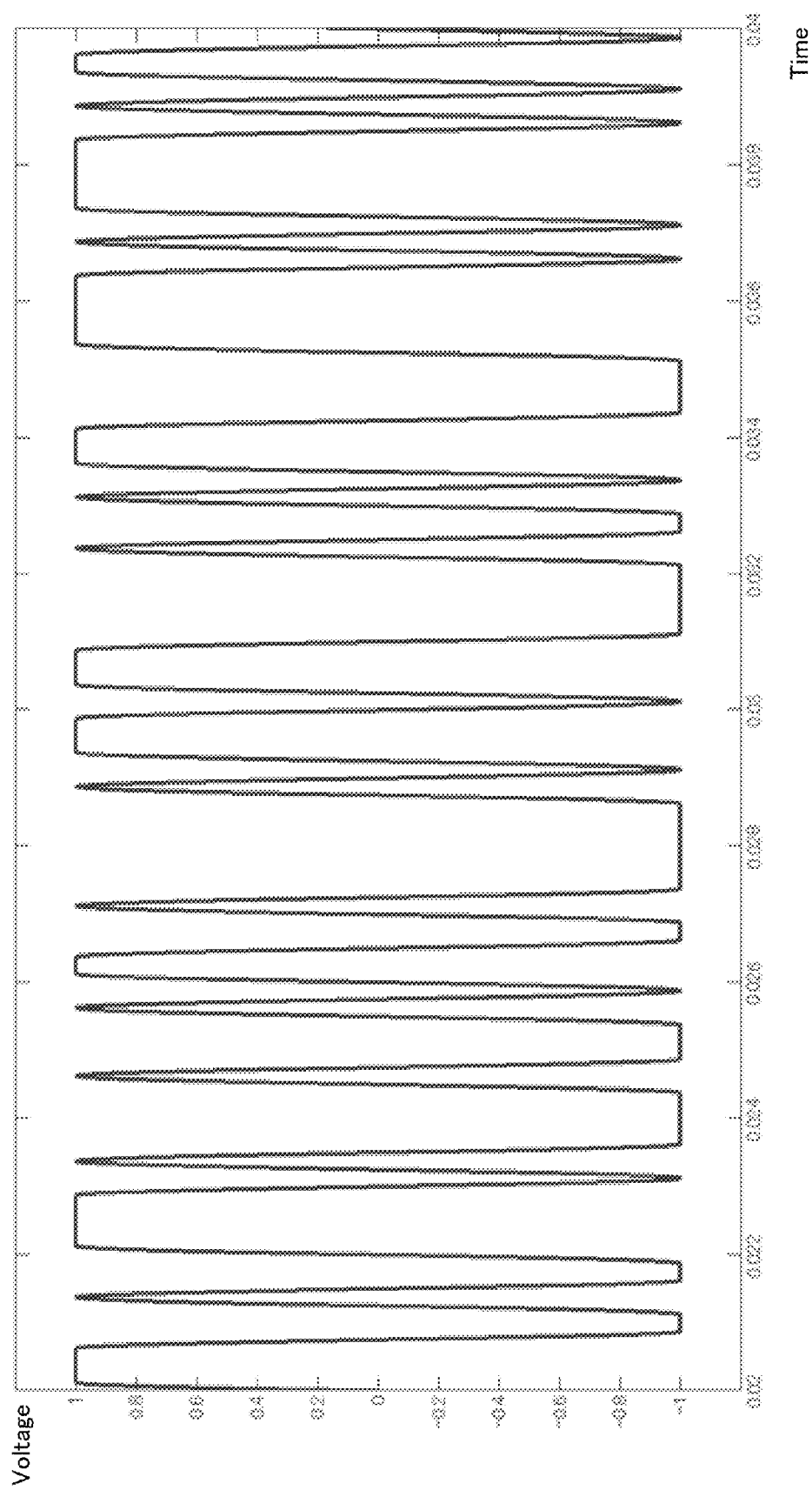
FIG. 5 shows a waveform of an output signal of the sine wave substituting device according to the first embodiment of the present invention.

The signal C00 is a signal having a Low logic level, and the signal C11 is a signal having a High logic level. In FIGS. 4 and 5 described later, the signal C00 is a signal having a Low logic level, i.e., a signal having a value of "−1".

Further, the signal C11 is a signal having a High logic level, i.e., a signal having a value of "1".

Regarding the remaining two signals C01, C10, the signal C01 is a signal having a level change from "0" to "1", and the signal C10 is a signal having a level change from "1" to "0".

The signals C01, C10 are inputted into the first sine wave substituting device 113 and the second sine wave substituting device 123, respectively where the transition parts of the signals are substituted with sine waves of which levels gradually vary.

The first sine wave substituting device 113 substitutes the transition part with a sine wave within a range of −π/2 to π/2. The second sine wave substituting device 123 substitutes the transition part with a sine wave within a range of π/2 to −π/2.

The first sine wave substituting device 113 and the second sine wave substituting device 123 have data tables of sine waves and the input signals are substituted with data in the data table. The data table is generated by the sine wave frequency determiner 122 on the basis of the baseband frequency information 1013.

Unless there is no limitation in frequency, it is recommended to use a frequency of the sine wave to be substituted is the same as that of the baseband signal.

Further, the baseband frequency information 1013 inputted into the sine wave substituting device 102 is divided into two signals 1013A, 1013B.

A signal 1013A determines a delay quantity (one cycle of the baseband signal) in the delay 121 describe above. For example, when the frequency of the baseband is 4 kHz, the delay quantity is 250 μs. The signal 1013B is inputted into the sine wave frequency determiner 122.

As described above, the sine wave frequency determiner 122 generates a data table of sine waves on the basis of the signal 1013B which is the baseband frequency information 1013.

The data table of sine waves generated by the sine wave frequency determiner 122 is sent as a signal 1112 to the first sine wave substituting device 113 and the second sine wave substituting device 123.

The switch 125 forms predetermined signal waves by appropriately switching based on two signals 1012A, 1012D among total four signals, i.e., the input signals C00, C11, an output signal C01 of the first sine wave substituting device 113 and an output signal C10 of the second sine wave substituting device 123.

One of the four signals is selected by the switch 125 to generate the output signal 1205.

In the signal 1205 outputted by the switch 125 through selection, high frequency components in frequency spectrum not lower than second harmonic wave can be reduced because the steep transition part of the digital signal is substituted with sine wave by the first sine wave substituting device 113 and the second sine wave substituting device 123.

In the above description, there is explanation of "the steep transition part of the digital signal is substituted with sine wave by the first sine wave substituting device 113 and the second sine wave substituting device 123". However, the signals in the sine wave substituting device 102 having sine waveform data are not analog signals, but digital signals.

More specifically, the sine waveform is represented by combination of digital signal (0, 1) of for example, eight bits.

<<Details in Delta Sigma Modulator>

Figure 3:
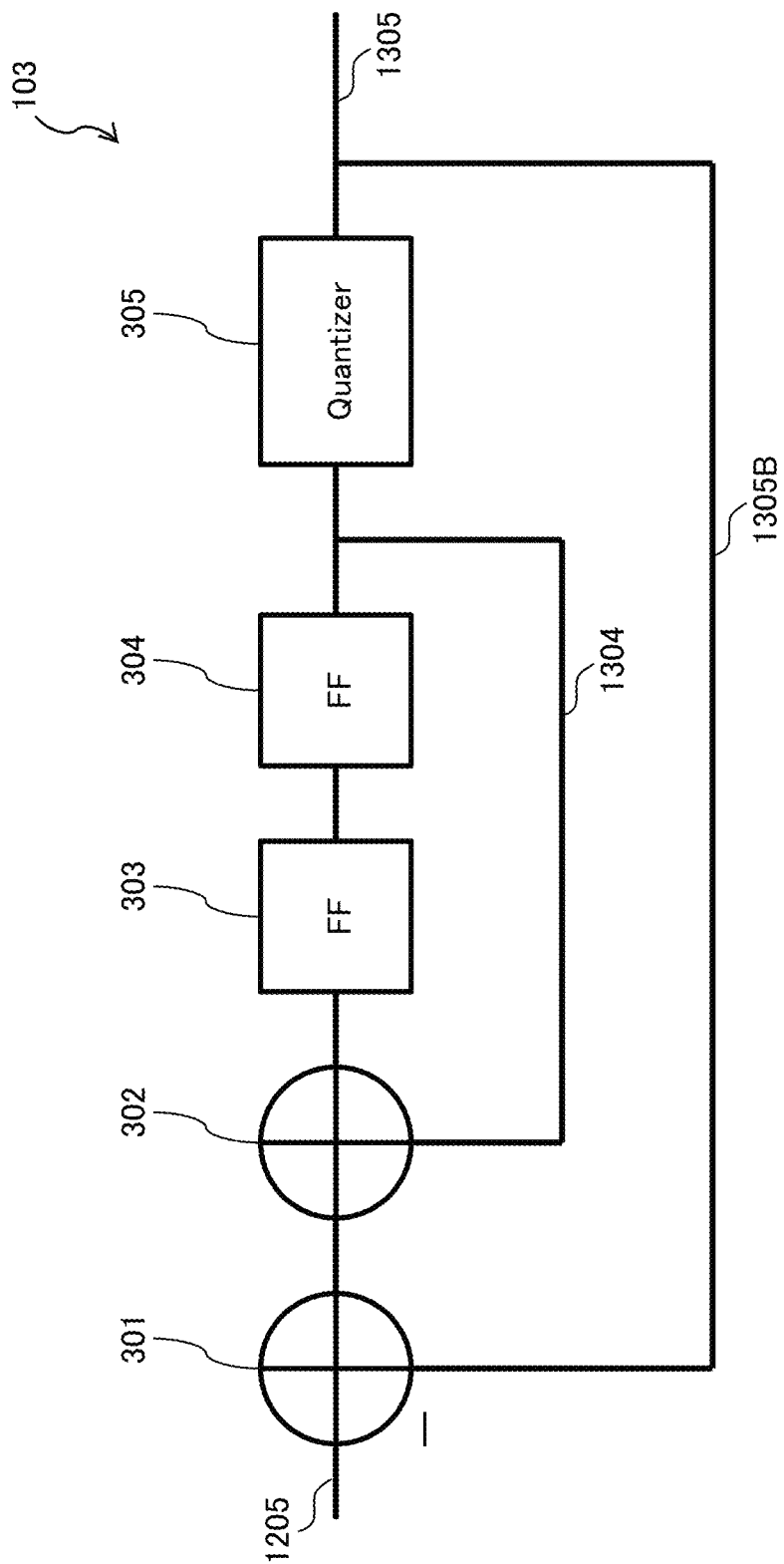
FIG. 3 is a delta sigma modulator according to the first embodiment of the present invention.

Next the delta sigma modulator 103 is described in detail. FIG. 3 is a delta sigma modulator (ΔΣ modulating circuit) according to the first embodiment of the present invention.

In FIG. 3, the inputted signal 1205 is inputted through a subtractor 301 and a adder 302 into flip flop circuits 303, 304 where the signal is delayed by two clocks and quantized by a quantizer 305 to have the baseband signal 1305 which is a binary signal.

A threshold of the quantizer 305 is a middle value of 0.5 with respect to amplitude of "1" of the input signal.

An output signal of the flip flop 304 is supplied to the adder 302 through a feedback line 1304 to be added to the input signal. An output 1305 of the quantizer 305 is supplied through a feedback line 1305B to the subtracter 301 where the input signal is subtracted by the output with the subtracter 301.

The delta sigma modulator 103 shown in FIG. 3 has a well-known circuit configuration and therefore, a detailed description is omitted.

In the delta sigma modulator 103 having the above-described configuration, the input signal has multivalue (for example, eight bits), is converted into an output signal having one bit, i.e., binary (0, 1). The use of the delta sigma modulator 103 can provide modulation of the input signal having a multi-value (for example, eight bits) into a binary output signal (one bit) in which a spectrum (frequency spectrum) of the input signal is maintained.

Regarding the modulation, it is desirable that the operation frequency of the delta sigma modulator 103 is sufficiently higher than that of the input signal, the operation frequency is determined in accordance with a clock frequency for the flip flop circuits 303, 304. In this embodiment, a 10 MHz is used as the operation frequency in contrast to the input signal of 4 kHz.

<<Simulation Result of Waveform>

Next, a simulation result of waveforms in the circuit used in the first embodiment is shown.

<<Output Waveform of Baseband Signal Generator>>

FIG. 4 shows a waveform of a baseband signal generated by the baseband signal generator 101 (FIG. 1) according to the first embodiment.

In FIG. 4, the axis of abscissa indicates lapse of time in second. The axis of ordinate represents a voltage in which High and Low levels are normalized as digital value of 1 and −1 which are exemplified together with a middle value.

The signal waveform of the baseband signal in FIG. 4 is configured with "1" and "−1", so that the signal waveform has an extremely high level of high frequency components at the transition period in which the signal varies because the signal waveform of the baseband signal has a high quantity of high frequency components.

<<Output Waveform in the Sine Wave Substitution Device>>

FIG. 5 shows a waveform of an output signal of the sine wave substituting device 102 according to the first embodiment of the present invention.

In FIG. 5, the axis of abscises indicates the lapse of time in second. The axis of ordinate represents voltage in which High and Low levels are normalized as 1 and −1 respectively, and a middle value is also indicated.

In FIG. 5, the signal has sine waveforms at transition period in which level changed from "1" to "−1" and from "−1" to "1". Accordingly, high frequency components are reduced.

In FIG. 5, in the transition period in which the signal varies from 1 to −1 and from −1 to 1, the signal is schematically shown as an analog signal, i.e. a sine wave for easy understanding. Actually, the signal is a digital signal having intermediate values represent by a plurality of bits (values of 0, 1, for example, eight bits) corresponding to the analog signal. More specifically, as described above, the sine wave substituting device 102, the baseband signal generator 101, and the delta sigma modulator 103 are configured using digital circuits operating with digital signals.

<<Output Waveforms in the Delta Sigma Modulator>>

Figure 6:
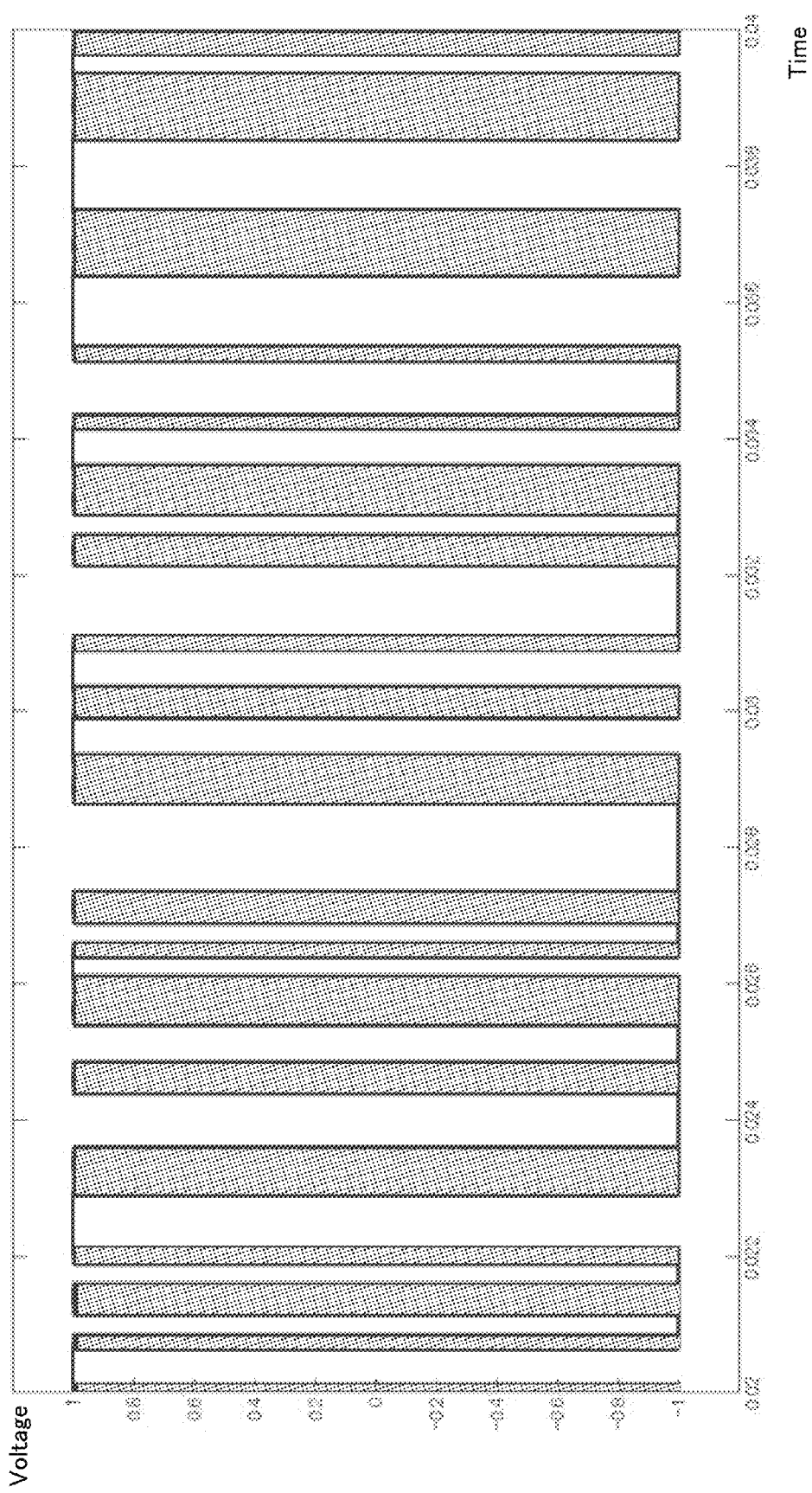
FIG. 6 shows a waveform of the output signal of a delta sigma modulator according to the first embodiment of the present invention.

FIG. 6 shows a waveform of the output signal of a delta sigma modulator 103 according to the first embodiment of the present invention.

In FIG. 6, the axis of abscissa represents lapse of time in second. The axis of ordinate represents a voltage in which the High and Low levels are normalized into digital value of 1 and −1 and a middle value is shown.

In FIG. 6, each of half tone parts represents a group of thin pulses (10 MHz). Further, a minimum time unit or representing 1 or −1 is 250 μs which is an inverse of 4 kHz.

Further, in FIG. 6, the signal expressed with a plurality of bits (for example, eight bits) shown in FIG. 5 is converted into binary signal of one bit (0, 1).

Figure 7A:
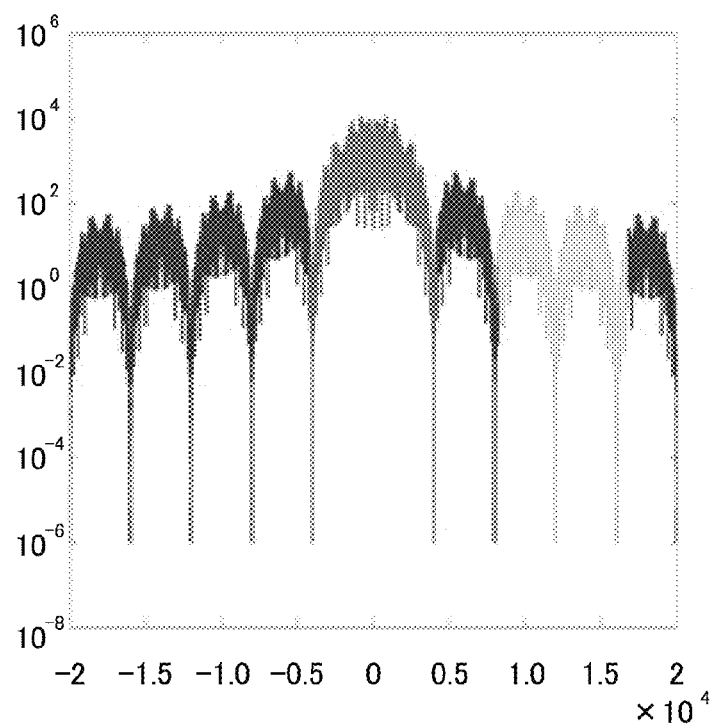
FIG. 7A is a frequency spectrum diagram of output signal of the baseband signal generator according to the first embodiment of the present invention.
Figure 7B:
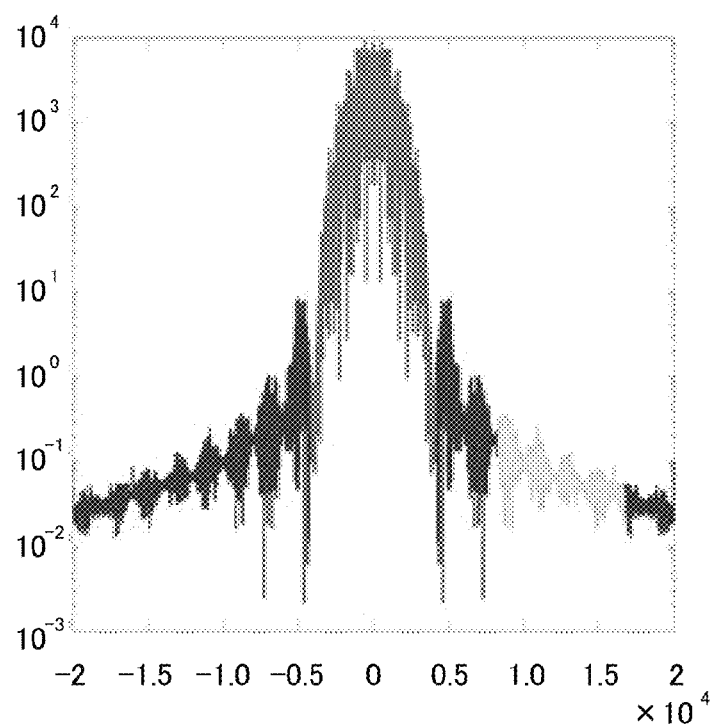
FIG. 7B is a frequency spectrum diagram of the output signals of the delta sigma modulator according to the first embodiment of the present invention.

Next, frequency spectrums of the output waveforms of the baseband signal generator 101 (FIG. 1) and the delta sigma modulator 103 (FIG. 1) are shown in FIGS. 7A and 7B.

<<Frequency Spectrum of Output Waveform in the Baseband Signal Generator>>

FIG. 7A shows a frequency spectrum diagram of output signal of baseband signal generator 101 (see FIG. 1) according to the first embodiment of the present invention.

In FIG. 7A, the axis of abscissa represents frequency in which a center is assumed as "0" and a right side end is $2 \times 10^4$ Hz. An axis of ordinate represents a power spectrum density (square of amplitude) which is relatively represented in legalism.

Both side ridges of a target ridge having a center at "0" of the abscissa are adjacent channels regarding radio communication. An adjacent channel leakage power to the target ridge having the center at "0" of the abscissa is about −20 dB measured in FIG. 7A.

<<Frequency Spectrum of Output Waveform of Delta Sigma Modulator>>

FIG. 7B is a spectrum diagram of the output signal waveform of the delta sigma modulator 103 (see FIG. 1) according to the first embodiment of the present invention.

In FIG. 7B, the axis of abscissa represents frequency and has a center at "0" of the axis of abscissa and the right end of the axis represents $2 \times 10^4$ Hz. The axis of ordinate represents power spectrum density (square of amplitude) which is relatively represented in legalism.

Both side ridges of a target ridge having a center at "0" of the axis of abscissa are adjacent channels regarding radio communication.

An adjacent channel leakage power to the target ridge having the center at "0" of the axis of the abscissa is about −50 dB measured in FIG. 7B.

<<Comparison Between FIG. 7A and FIG. 7B in Frequency Spectrum>>

In comparison of a spectrum of the output waveform of the delta sigma modulator 103 shown in FIG. 7B with the output waveform of the baseband signal generator 101 (see FIG. 1), heights of the ridges on both side of the ridge at the center of axis of abscissa in FIG. 7B become lower than those in FIG. 7A.

In a radio apparatus or a transmitter, adjacent ridges on both side of the ridge in spectrum having a center at "0" of the axis of abscissa may correspond to adjacent channels.

In FIGS. 7A and 7B, influence on a signal of the adjacent ridge, i.e., an adjacent channel leakage power is about −20 dB in FIG. 7A as described above, and that in FIG. 7B is about −50 dB.

In FIG. 1, there are the sine wave substituting device 102 and the delta sigma modulator 103 between the output of the baseband signal generator 101 and the output of the delta sigma modulator 103.

As described above, the delta sigma modulator 103 has such a function and a characteristic as to modulate the input signal having multi-values into the binary output signal while the spectrum of the input signal is maintained.

Accordingly, the adjacent channel leakage power, reflecting the spectrum characteristic is about −20 dB in FIG. 7A. On the other hand, that in FIG. 7B is about −50 dB. This is largely caused by providing the sine wave substituting device 102 (see FIG. 1) in reducing the adjacent channel leakage power.

In other words, this corresponds to an effect of substituting transition part of signal waveform from "0" to "1" or "1" to "0" with sine waveforms.

In consideration that the adjacent channel leakage power defined in the standard of a specific small power wireless communication method at 420 MHz is −40 dB, if the sine wave substituting device 102 is not provided, the adjacent channel leakage power is about −20 dB as described regarding FIG. 7A. This is out of the standard.

On the other hand, in the present invention, as shown in FIG. 1, the sine wave substituting device 102 is provided, so that the adjacent channel leakage power is about −50 dB at the output of the delta sigma modulator 103 as described referring to FIG. 7B.

This provides satisfaction of the standard of the specific small power wireless communication method at 420 MHz, so that band limitation for the baseband signal can be provided without using an additional special filter.

Because the pass band of the band-pass filter 106 shown in FIG. 1 is outside the frequency ranges shown in FIGS. 7A, 7B, the band-pass filter 106 does not influence on the frequency ranges in FIGS. 7A and 7B.

<Receiver>

Next, an example configuration of a receiver is described hereinafter.

Figure 8:
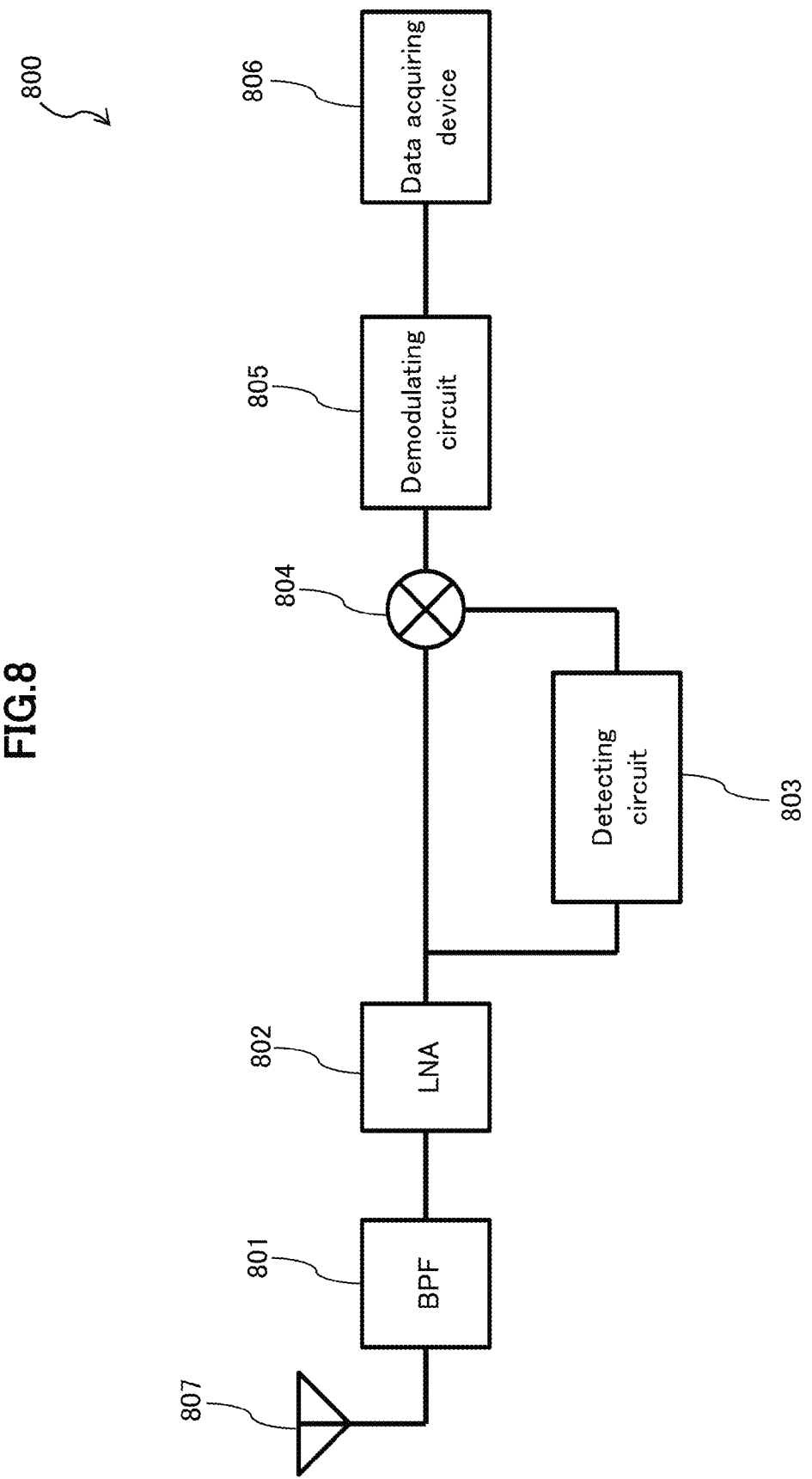
FIG. 8 is a block diagram of an example of a receiver as a radio apparatus according to the first embodiment of the present invention.

FIG. 8 is a block diagram of an example of a receiver as a radio apparatus according to the first embodiment of the present invention.

In FIG. 8, a reception signal is received by an antenna (receiving antenna) 807, thereafter undergone band-limitation by a band-pass filter (BPF) 801, and amplified by a low noise amplifier (LNA) 802.

The amplified signal is divided into two signals. One of the signals is inputted into the detecting circuit 803 and used for reproduction of the carrier frequency.

The other one of the signals is multiplied by a carrier wave reproduced by the detecting circuit 803 with a multiplier 804.

Further, after demodulation by a demodulating circuit 805, the transmitted baseband signal included in the reception signal can be obtained by a data acquiring device 806.

Combination of the receiver shown in FIG. 8 and the transmitter according to the first embodiment provides a radio apparatus set. The use of the transmitter according to the first embodiment provides a radio apparatus set with a smaller circuit scale.

In addition, it is also possible to use, for example, a synchronous detecting circuit in place of a detecting circuit 803.

Comparative Example

Figure 16:
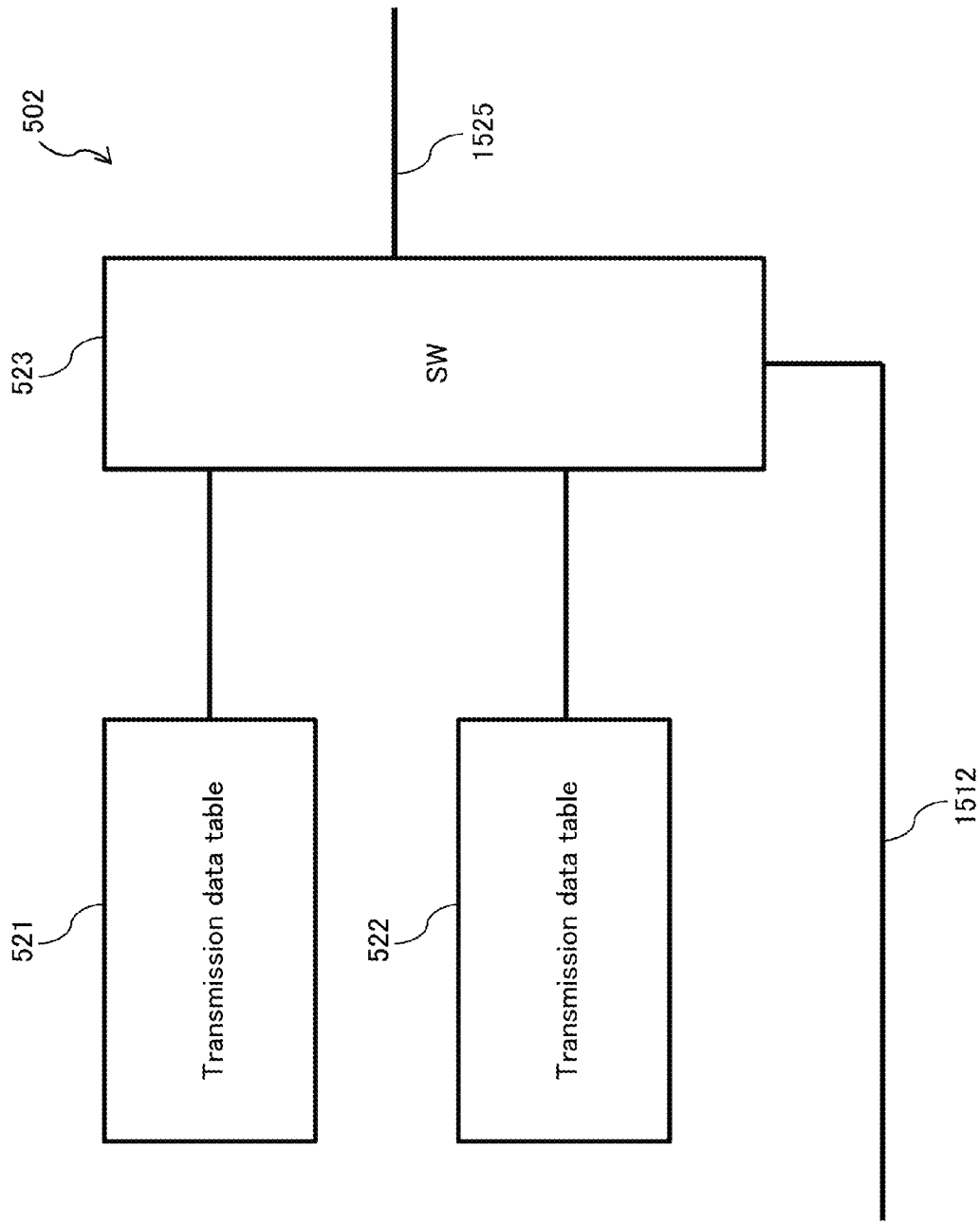
FIG. 16 is a block diagram of a transmission data generator according to the fifth embodiment of the present invention.
Figure 17:
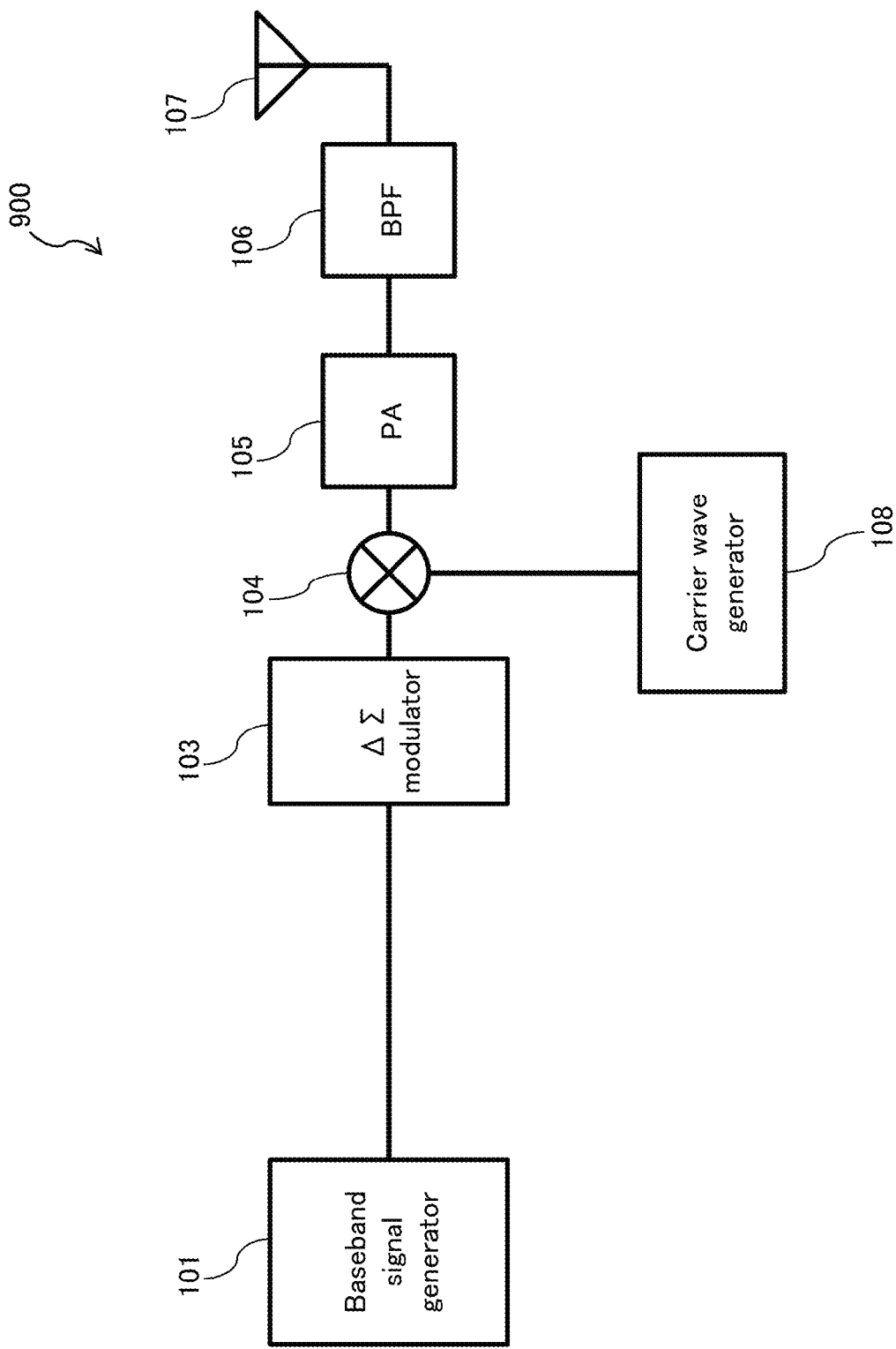
FIG. 17 is a block diagram of a transmitter as a comparison example.

FIG. 17 is a block diagram of a transmitter 900 as a comparative example. FIGS. 9 to 16 are described later.

In FIG. 17, the transmitter 900 is configured including the baseband signal generator 101, the delta sigma modulator 103, the multiplier 104, the carrier wave generator 108, the power amplifier 105, the band-pass filter (BPF) 106, and the antenna 107.

A difference between the transmitter 900 as a comparative example shown in FIG. 17 and the transmitter 100 according to the first embodiment shown in FIG. 1 is that the sine wave substituting device 102 shown in FIG. 1 does not included in the transmitter 900 in FIG. 17.

More specifically, in the transmitter 900 as the comparative example, the waveform of the baseband signal shown in FIG. 4 is directly inputted into the delta sigma modulator 103.

In the transmitter 100 according to the first embodiment of the present invention shown in FIG. 1, at the variation from High to Low of the signal shown in FIG. 5 or inverse variation, the waveform at the variation is substituted by sine waves and inputted into the delta sigma modulator 103. Accordingly, the transmitter 900 in FIG. 17 as the comparative example has much high frequency components than the case of the transmitter 100 in FIG. 1. Further, an adjacent channel leakage power is large. Accordingly there is a problem in that the circuit configuration shown in FIG. 17 is not for actual use.

In the transmitter 100 according to the first embodiment of the present invention, the sine wave substituting device 102 shown in FIG. 1 is installed to solve the problem of the transmitter 900 as the comparative example shown in FIG. 17.

Second Embodiment

A second embodiment is described hereinafter with a transmitter 200 as an example in which a communication data quantity is increased without increase in the baseband frequency using QPSK (Quadrature Phase Shift Keying) in place of the BPSK (Binary Phase Shift Keying) used in the first embodiment.

Figure 9:
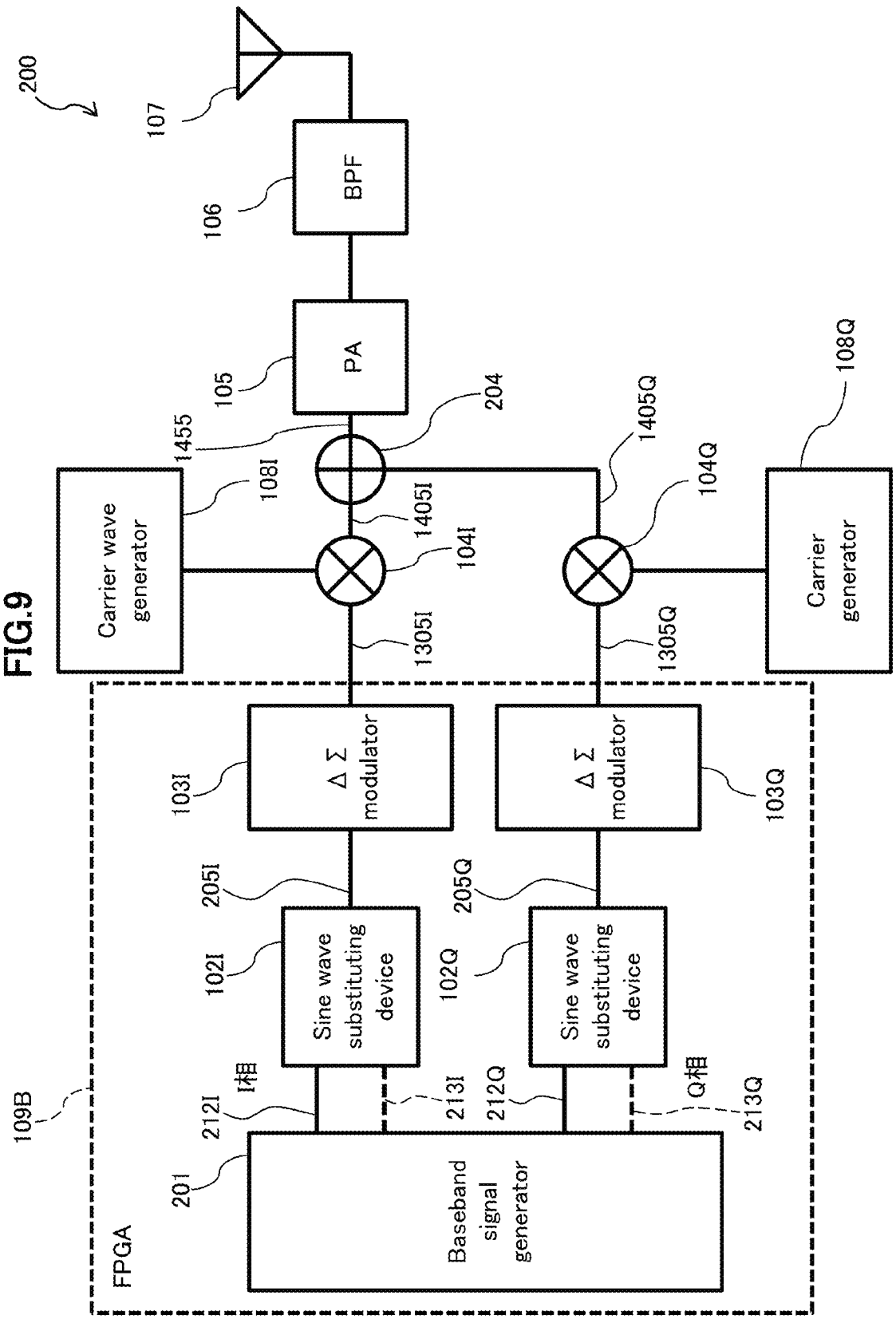
FIG. 9 is a block diagram of a transmitter as a radio apparatus according to a second embodiment of the present invention.

FIG. 9 is a block diagram illustrating a configuration example of a transmitter as a radio apparatus according to a second embodiment of the present invention.

In FIG. 9, one sine wave substituting device 102 and one the delta sigma modulator 103 are shown in FIG. 1, which are replaced with two sine wave substituting devices 102I, 102Q and two delta sigma modulators 103I, 103Q in FIG. 9.

Further, there were one carrier wave generator 108 and one multiplier 104 in FIG. 1, which are replaced with two carrier wave generators 108I, 108Q in FIG. 9.

In addition, an adder 204 is additionally installed in FIG. 9 for synthesizes two carrier waves modulated by multipliers 104I, 104Q, respectively.

The power amplifier 105, the band-pass filter 106, and the antenna 107 in FIG. 9 are the same as those in FIG. 1.

Further, the sine wave substituting devices 102I, 102Q have the same circuit configuration as the sine wave substituting device 102 shown in FIG. 2 has.

Further, the delta sigma modulators 103I, 103Q have the same circuit configuration as the delta sigma modulator 103 shown in FIG. 3.

In FIG. 9, the signal generator 201 generates two baseband signals of I phase and Q phase of QPSK. The baseband signal generator 201 supplies a baseband signals 212I, 212Q and baseband frequency information 213I, 213Q to the sine wave substituting devices 102I, 213Q, respectively.

The baseband signals 212I, 212Q are, as described above, substituted with the sine waves at the variation points from "0" to "1" or "1" to "0" by the sine wave substituting devices 102I, 102Q having the same configurations as shown in FIG. 2, respectively.

Output signals 205I, 205Q (for example, eight-bit signals) are inputted into the delta sigma modulators 103I, 103Q and modulated binary (1 bit) signals 1305I,1305Q and are outputted, respectively.

Signals 1305I, 1305Q outputted by the delta sigma modulators 103I, 103Q are used to modulate the carriers with the multipliers 104I, 104Q as two modulated carrier waves 1405I, 1405Q, respectively.

In this operation, the I-phase carrier wave generator 108I generates a sine wave and the Q-phase carrier generator 108Q generates a cosine wave. Because the sine wave and the cosine waves are different only in phase from each other, the carrier wave generator 108I and the carrier wave generator 108Q have the same circuit configurations.

The two carriers are added to each other by the adder 204 to be synthesized as one modulated carrier wave (one the modulated carrier adders 104I, 104Q as a modulated carrier 1455.

The modulated carrier wave 1455 is amplified by the power amplifier 105 and band-limited by the band-pass filter 106 and outputted as an electromagnetic wave by the antenna 107 (transmission antenna).

The configuration of the transmitter 200 is used as a radio apparatus according to the second embodiment of the present invention as shown in FIG. 9, which provides communication using QPSK without using a filter for the baseband signal.

The use of the QPSK increases a communication data quantity without increase in the frequency of the baseband signal.

In other words, a transmitter and a radio apparatus having a large data quantity is provided on a small circuit scale.

Third Embodiment

An example is shown in which a sigmoid function is used in place of the sine wave used in the first embodiment.

Figure 10:
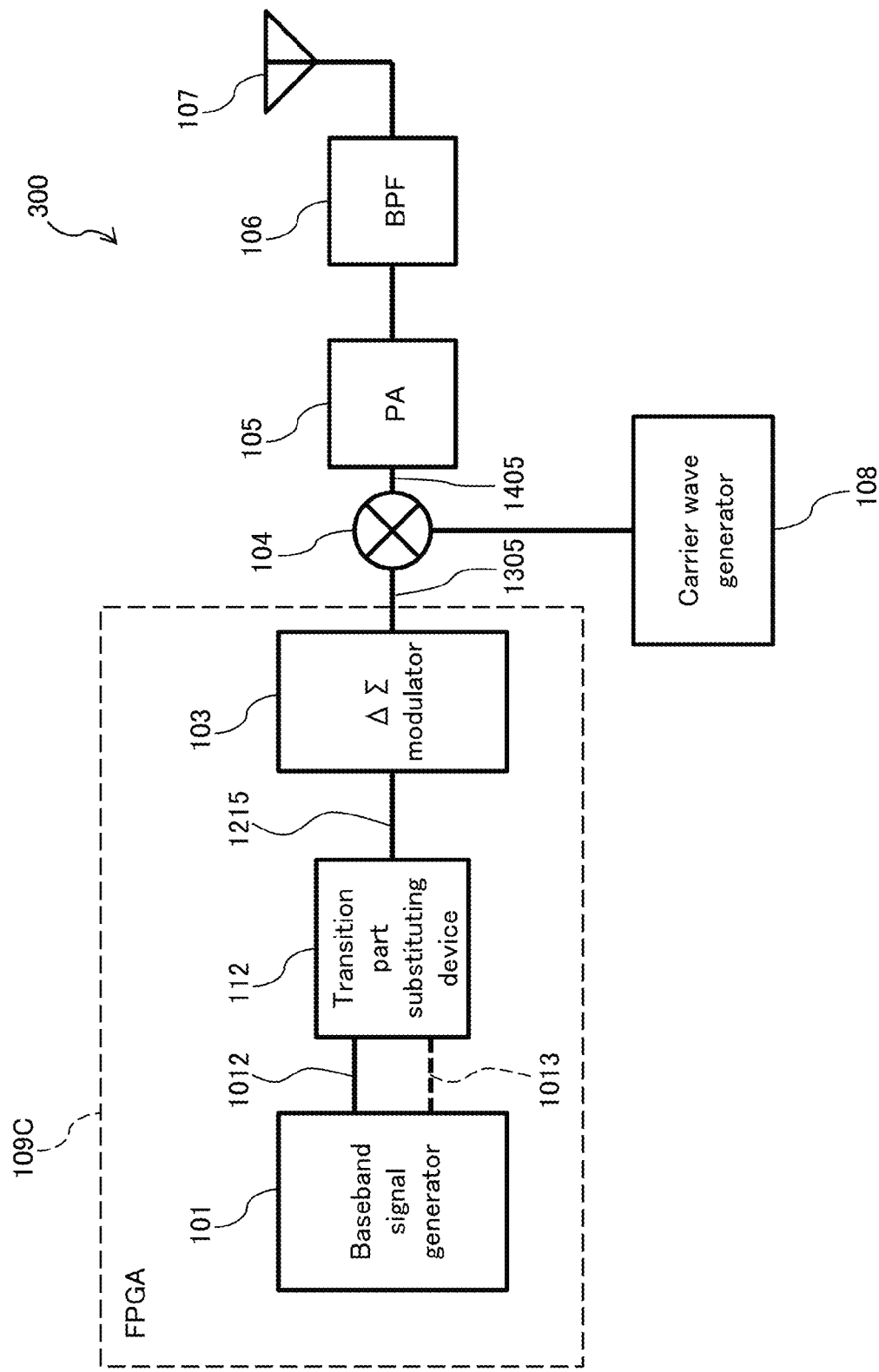
FIG. 10 is a block diagram illustrating an example of a transmitter as a radio apparatus according to a third embodiment of the present invention.

FIG. 10 is a block diagram illustrating an example of a transmitter as a radio apparatus according to a third embodiment of the present invention. In FIG. 10, in place of the sine wave substituting device 102 in FIG. 1, the transition part substituting device 112 is provided. A transition part substituting device 112 makes substitution at variation points varying from "0" to "1" or "1" to "0" using the sigmoid function.

Figure 11:
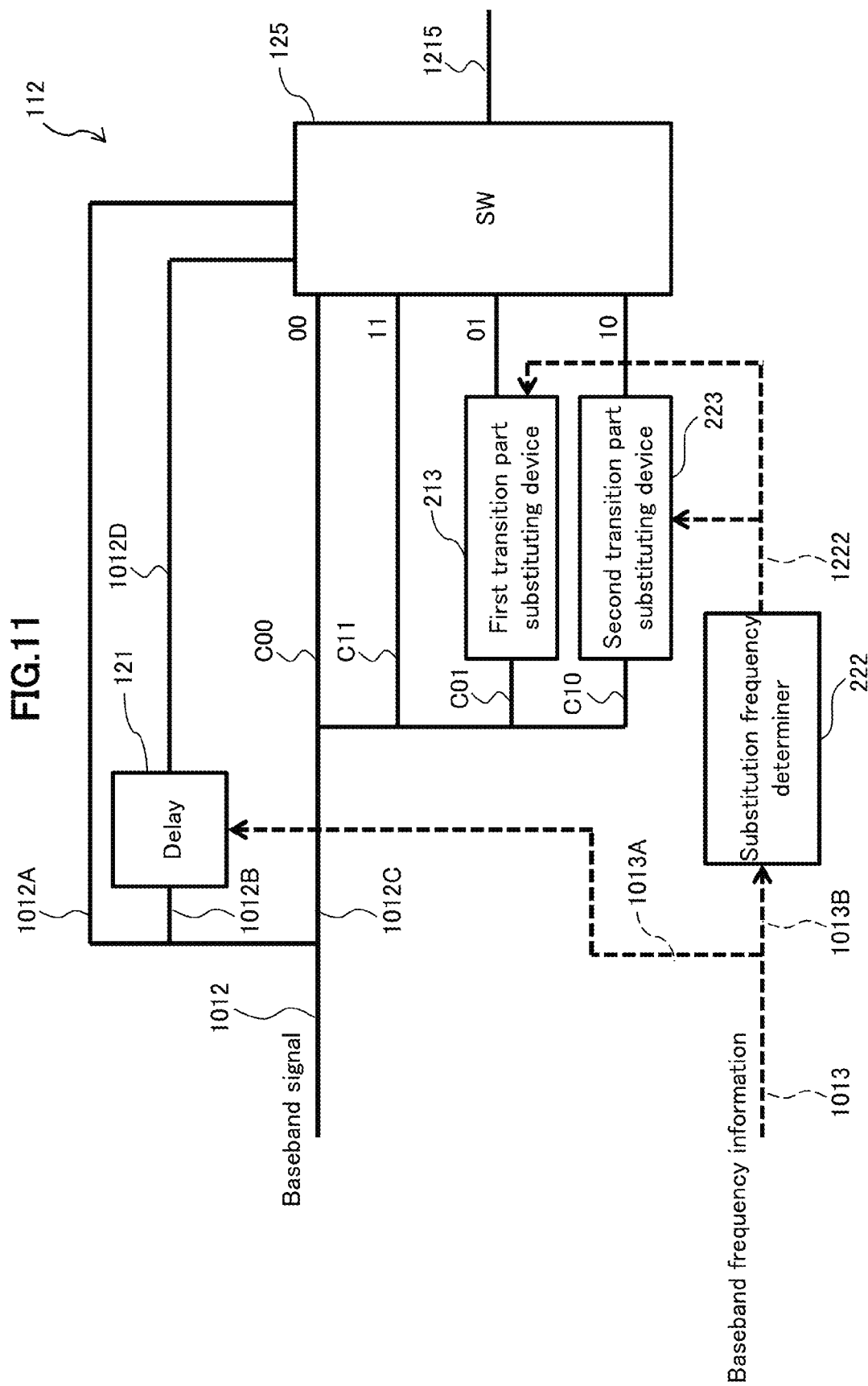
FIG. 11 is a block diagram of an example of a transition part substituting device according to the third embodiment of the present invention.

FIG. 11 is a block diagram of an example of a transition part substituting device 112 according to the third embodiment of the present invention. The first sine wave substituting device 113, the second sine wave substituting device 123, and the sine wave frequency determiner 122 shown in FIG. 2 are replaced with a first transition part substituting device 213 and a second transition part substituting device 223, a substitution frequency determining device 222 in FIG. 11, respectively.

Further, except the places in FIG. 10 where the sine wave substituting device 102 is replaced with the transition part substituting device 112 and the place described above in FIG. 11, other common parts have the same function and configuration.

The description of the configuration of the common part is omitted because the explanation is duplicated.

<<Sigmoid Function>

The sigmoid function is a function represented by the following Eq. (1).

$$y = \frac{1}{1+\exp(-ax)} \quad \text{Eq. (1)}$$

In Eq. (1), "x" is a variable, and "a" is a constant value. In the third embodiment, a function when a=1, which is a standard type, is used. Further, the function when a=1 is appropriately represented by "Standard sigmoid function" or "Standard type of sigmoid function".

Like the first embodiment, a substitution table for the sigmoid function (standard sigmoid function) is generated from the baseband frequency information 1013, the signal 1013B by the substitution frequency determiner 222 (see FIG. 11).

In this operation, a range of x is limited to (−6<x<6) to match sigmoid function with the period of the baseband signal 1012 (see FIG. 11).

For example, the frequency of the baseband signal is 4 kHz, assuming that time is t "x" and "t" are converted, using the following Eq. (2).

$$x = \frac{12}{250} \times 10^6 \times t \qquad \text{Eq. (2)}$$

When conversion is made as described above, rising timing of the sigmoid function is synchronized with the baseband signal. Further, one cycle of 4 kHz is $250 \times 10^{-6}$ sec. Further, an interval within a range of (−6<x<6) is 12.

Further, because the range in the y axis of the Sigmoid function is (0<y<1), it is possible to make a range of z as a variable (−1<z<1) by conversion by Eq. (3).

$$z = (y - 0.5) \times 2 \qquad \text{Eq. (3)}$$

Next, comparison is made between the case where the sine wave is used in the sine wave substituting device 102 (see FIG. 1) in the first embodiment and the case where the standard type of Sigmoid function (standard sigmoid function) is used in place of the sine wave in the transition part substituting device 112 (see FIG. 10) in the third embodiment.

Figure 12:
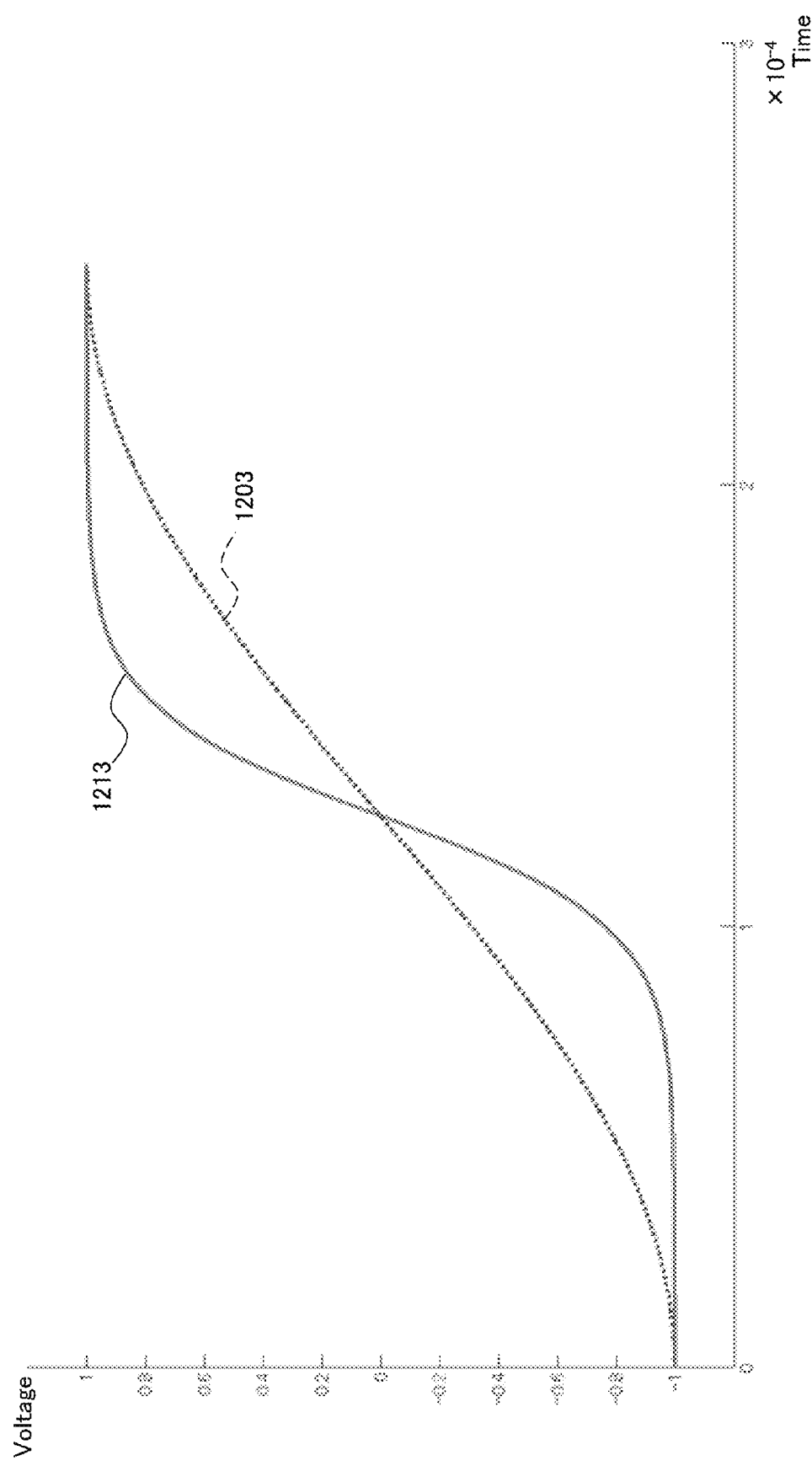
FIG. 12 is a chart illustrating a sine wave and a standard sigmoid function for comparison.

FIG. 12 shows a chart illustrating a sine wave and a standard sigmoid function for comparison therebetween.

In FIG. 12, the axis of abscissa represents time and the axis of ordinate represents a function value from 1 to −1. Further, the function value from "1" to "−1" corresponds to from "High" to "Low" in voltage.

As shown in FIG. 12, a sine wave 1203 is a single frequency. On the other hand, the standard sigmoid function 1213 is configured including a plurality (or an infinite number) of frequencies or being synthesized.

Accordingly, the spectrum of the replaced function spreads broader than the case of the sine wave 1203, so that influence of the original baseband signal on the spectrum can be reduced.

Further, in the third embodiment, a standard type of the sigmoid function (standard sigmoid function) is used. However, the same effect can be provided with different values in "a" or other functions (for example, cumulative distribution function), etc.

Fourth Embodiment

An example of a fourth embodiment of the present invention is described below to reduce the number of components by installing the carrier wave generator and the multiplexer are also installed in the FPGA, which were installed outside the FPGA in the first embodiment.

Figure 13:
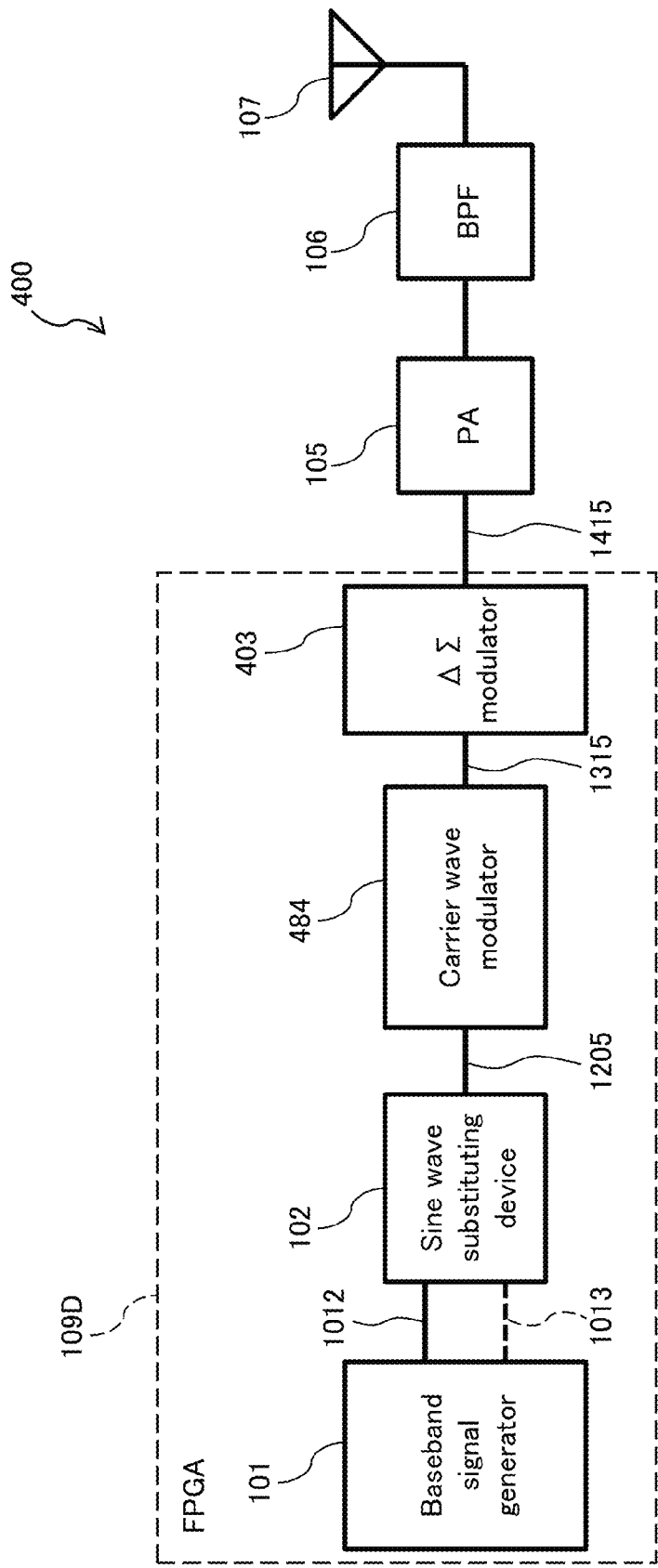
FIG. 13 is a block diagram illustrating an example of a transmitter as a radio apparatus according to a fourth embodiment of the present invention.

FIG. 13 is a block diagram illustrating an example of a transmitter 400 as a radio apparatus according to a fourth embodiment of the present invention.

In FIG. 13, the baseband signal generator 101, the sine wave substituting device 102, a carrier wave modulator 484, and a delta sigma modulator 403 are all installed in FPGA 109D which are all digital circuits.

More specifically, in FIG. 1, the carrier wave generator 108 and the multiplier 104 are installed outside the FPGA 109 as analog circuits. In FIG. 13, the carrier wave generator 108 and the multiplier 104 are omitted and the carrier wave modulator 484 is installed as the digital circuit to perform the function of the carrier wave generator 108 and the multiplier 104.

The carrier wave modulator 484 is installed in the FPGA 109D as a digital circuit.

As described above, the feature of a transmitter 400 according to the first example of the fourth embodiment of the present invention shown in FIG. 13 is in that the carrier wave modulator 484 is installed in the FPGA 109D as a digital circuit. Accordingly, the carrier wave modulator 484 of the transmitter 400 is described in detail below.

<<Carrier Wave Modulating Device>>

Figure 14:
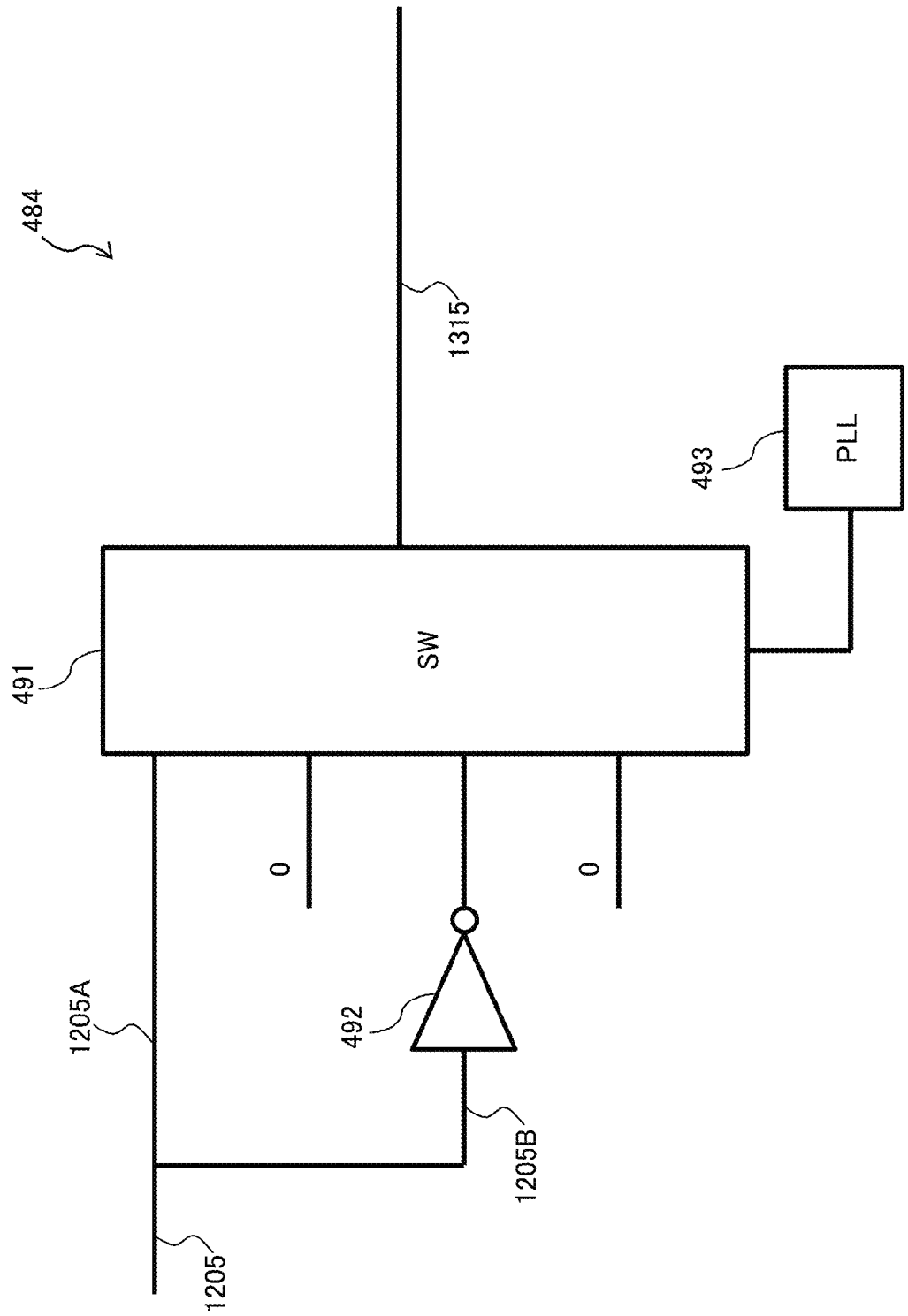
FIG. 14 is a block diagram illustrating an example of a carrier wave modulator according to the fourth embodiment of the present invention.

FIG. 14 is a block diagram illustrating an example of the carrier wave modulator 484 according to the fourth embodiment of the present invention. In FIG. 14, the carrier wave modulator 484 is configured including a switch (SW) 491 for making switching among four inputs, an inverter 492, and a PLL 493.

The signal 1205 outputted by the sine wave substituting device 102 (see FIG. 13) is divided into two signals 1205A, 1205B. One (the signal 1205B) of the signals is directly inputted into the first input of a switch 491. The other signal 1205B is inverted in voltage with the inverter 492 and the output is inputted into the third input of the switch 491.

A second input and fourth inputs to the switch 491 are supplied with a constant of zero (Low).

The switch 491 is subject to switching from the first input to the fourth input in response to the clock signal generated by the PLL 493 to output a signal 1315.

More specifically, the potentials of the signal 1205, 0, an inversion signal of the signal 1205, and potential of zero (potentials) are outputted sequentially.

Further, the frequency of the PLL 493 is four times the desired carrier frequency. This operation provides an output 1315 of the switch 491 corresponding to a carrier wave undergone four-times over sampling multiplied with the baseband signal undergone the sine wave substitution.

Further, the multiplier 104 in the first embodiment shown in FIG. 1 is represented as the carrier wave modulator 104. The carrier wave modulator 484 in the fourth embodiment shown in FIG. 14 is also represented as the "carrier wave modulator". However, the configuration and operation are different from those of the multiplier 104.

Returning to FIG. 13, the transmitter 400 according to the fourth embodiment is further described.

In FIG. 13, the carrier wave modulated by the carrier wave modulator 484 is inputted into the delta sigma modulator 403.

The delta sigma modulator 403 in FIG. 13 has the same configuration as the delta sigma modulator 103 shown regarding FIGS. 1 and 3.

In addition, it is desirable that the operation frequency of the delta sigma modulator 403 is not smaller than four times the carrier frequency.

The output signal 1415 modulated into a binary signal by the delta sigma modulator 403 is outputted as the digital signal 1415 from the FPGA 109D as the digital signal 1415.

The digital signal 1415 as an output signal of the FPGA 109D is transmitted by the antenna 107 through the power amplifier 105 and the band-pass filter (BPF) 106. Because the signal flow and configuration after the power amplifier 105 are the same as those of the first embodiment referring to FIG. 1, a duplicated explanation is omitted.

It is noted that the output of the delta sigma modulator 403 has such an important feature that the output of the delta sigma modulator 403 returns to be a sine wave by allowing the output to pass through the band-pass filter 106.

This means that the transmission signal can be generated by only allowing the output signal to pass through the existent filter (the band-pass filter 106) without using a digital to analog converter, etc.

Accordingly according to the forth embodiment, a radio apparatus, and the transmitter 400 can be provided with the number of components being reduced.

Fifth Embodiment

Figure 15:
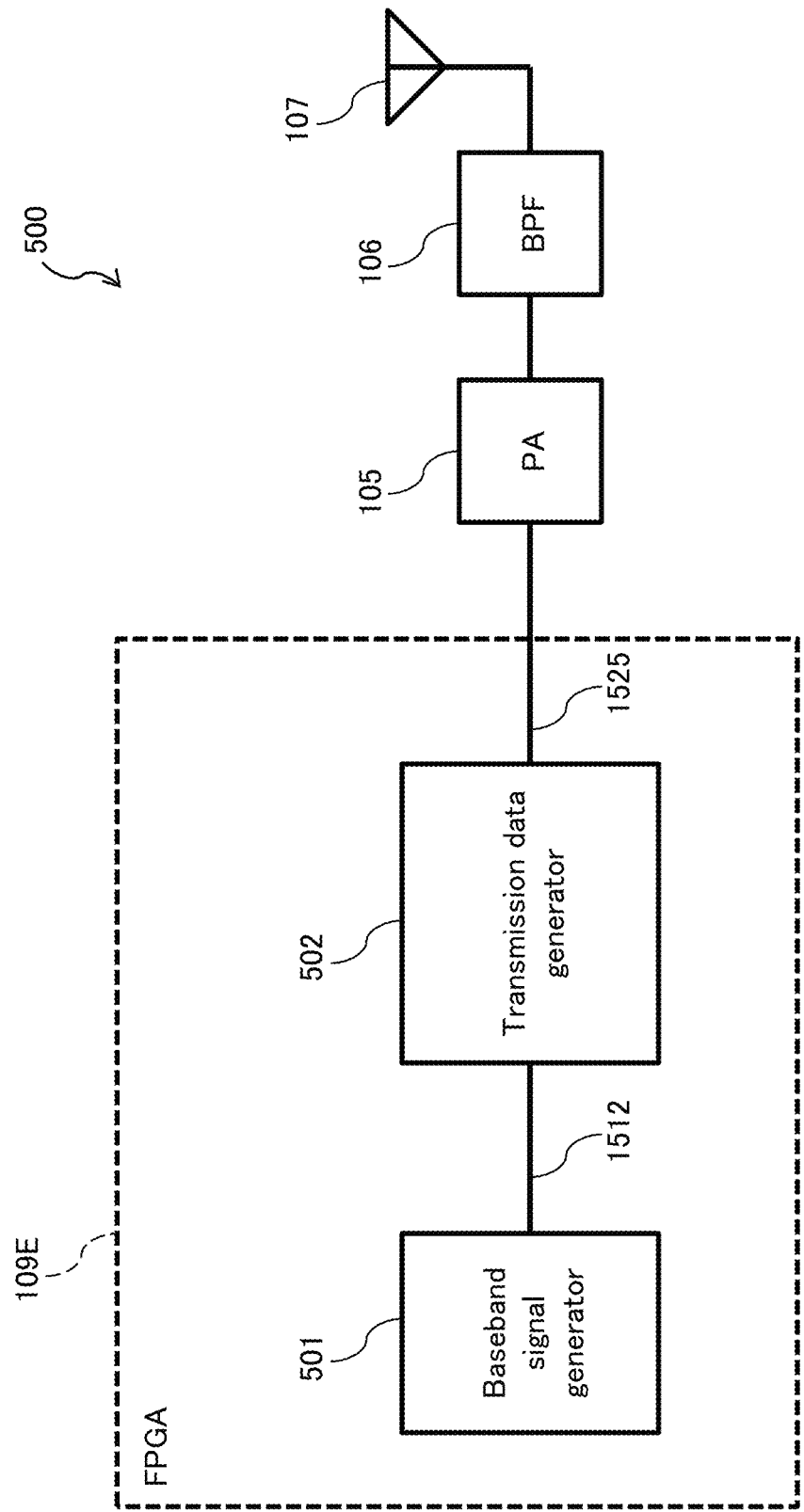
FIG. 15 is a block diagram illustrating an example of a transmitter as a radio apparatus according to a fifth embodiment of the present invention.

As a radio apparatus according to a fifth embodiment, a configuration example is shown in FIGS. 15 and 16. The circuit configuration can be simplified by fixing the frequency of the baseband signal and the carrier wave.

FIG. 15 is a block diagram illustrating an example of a transmitter 500 as a radio apparatus according to a fifth embodiment of the present invention.

In FIG. 15, installed on a FPGA 109E as a digital circuit are the baseband signal generator 501 and the transmission data generator 502.

Comparing FIG. 15 with FIG. 13 showing the fourth embodiment, functions of the sine wave substituting device 102, the carrier wave modulator 484, and the delta sigma modulator 403 are provided by the transmission data generator 502 in FIG. 15. Accordingly, the transmission data generator 502 of the transmitter 500 is described in detail below.

In FIG. 15, the baseband signal generator 501 outputs the transmission data in values of "0" and "1". A signal 1521 of the transmission data is applied to the transmission data generator 502.

The transmission data generator 502 is provided with a transmission data table previously, and converts the input signal into the transmission data on the basis of the transmission data table and outputs the transmission data as a signal 1525, A circuit configuration of the transmission data generator 502 is described hereinafter.

<<Transmission Data Generator>>

FIG. 16 is a block diagram of a transmission data generator 502 according to the fifth embodiment of the present invention.

In FIG. 16, the transmission data generator 502 is configured including two transmission data tables 521, 522, and a switch 523.

The transmission data tables 521, 522 hold transmission data which is derived by calculation of a signal processing for converting the baseband signal into the transmission data. The binary signal 1521 is inputted to the switch 523 which makes selection between the transmission data tables 521, 522. The selected signal is outputted as the output signal 1525 of the switch 523.

In FIG. 13 illustrating the circuit configuration according to the fourth embodiment, when frequencies of the baseband signal and the carrier wave are previously determined, internal operations in the sine wave substituting device 102, the carrier wave modulator 484 and the delta sigma modulator 403 depend on only the baseband signal generated in the baseband signal generator 101.

In the case of BPSK, the output of the baseband signal generator 101 is "0" or "1". Accordingly, the output of the FPGA 109D can be previously calculated.

From the above-described reason, because the output when the baseband signal is "0" can be calculated previously, the calculation result is held as data in the transmission data table 521.

Further because the output when the baseband signal is "1" can be calculated previously, the calculation result is held as data in the transmission data table 522.

The output 1512 (see FIGS. 15 and 16) of the baseband signal generator 501 (see FIG. 15) can switch the switch 523, so that the output signal 1525 equivalent to an output signal 1425 shown in FIG. 13 in the fourth embodiment can be obtained at the signal 1525 of the transmission data generator 502 shown in FIGS. 15 and 16.

Returning to FIG. 15, the transmitter 500 is further described below. In FIG. 15, a signal 1525 outputted by the FPGA 109E is transmitted by the antenna (transmission antenna) 107 through the power amplifier 105, and the band-pass filter 106.

The signal flow and configuration after the power amplifier 105 are the same as those in the first embodiment in FIG. 1 and the fourth embodiment, and a duplicated explanation is omitted.

According to the fifth embodiment, when the frequencies of the baseband signal and the carrier waves are fixed, the fifth embodiment provides the same effect as the fourth embodiment with a simpler circuit configuration.

Further, when only the frequency of the baseband is fixed, the circuit configuration can be made simpler by replacing the circuits according to the first embodiment with the transmission data generator 502 similarly to make the circuit configuration simpler. More specifically this provides improvement in miniaturization, a lowering the cost, and reliability.

Other Embodiments

As described above, the present invention has been made with concrete explanation on the basis of the embodiments. However, the present invention is not limited to the above-described embodiments and can be variously modified without departure of the subject matter.

Other embodiments and modification are further described herein after.

<<Modulator and Carrier Wave Modulator>>

In the first to fifth embodiments, the present invention has been described as the radio apparatus or the transmitter including the multiplier 104, the carrier wave generator 108, the power amplifier 105, the band-pass filter 106, and the antenna 107. However, a modulator including the baseband signal generator 101, the sine wave substituting device 102, and the delta sigma modulator 103 are also useful.

Further, the present invention is useful as a carrier wave modulator which generates a modulated carrier wave including the baseband signal generator 101, the sine wave substituting device 102, and the delta sigma modulator 103, the carrier wave generator 108, and the multiplier 104.

For example, depending on the use, the present invention can be replaced with other configuration in which the power amplifier 105, the band-pass filter 106, and an antenna 107 are not necessary.

<<Transition Part Substituting Device>>

In FIG. 9 shown in the second embodiment and FIG. 13 shown in the fourth embodiment, the sine wave substituting devices 102I, 102Q, 102 have been described as devices to make substitution with sine waves at transition parts 0 from "0" to "1" and "1" to "0". However, the substitution may be made using a sigmoid function (including standard sigmoid functions) and a cumulative distribution function.

<<Transmission Data Generator>>

In FIG. 15 showing the fifth embodiment, explanation was made such that the transmission data generator 502 is provided by substitution of the function of the sine wave substituting device 102, the carrier wave modulator 484, and the delta sigma modulator 403.

Further, the sine wave substituting device 102 may be replaced with the transition part substituting device 112 of the third embodiment shown in FIG. 10. More specially, substitution may be made with a sigmoid function (including standard sigmoid function) or a cumulative distribution function.

<<FPGA>>

In the first to the fifth embodiments, the FPGAs 109, 109B, 109C, 109D, and 109E are all formed with digital circuits. However, not all circuits are formed with digital circuits.

For example, a part of the FPGA is formed including an Analog-to-digital converter or an analog circuit such as an oscillator or a RAM ((Random Access Memory), or ROM (Read Only Memory). In this case, further various functions may be provided at the same time.

Further, the FPGA (Gate Array) forming a digital circuit can be used as a digital circuit by designing and modifying a wiring layer irrespective of the field programming function in the FPGA. In this case, a cost reduction may be provided for mass production.

<<Frequency>>

In the first embodiment, explanation has been made with assumption that the radio apparatus uses 420 MHz band, 4 KHz is used for the baseband signal, and the operation frequency of the delta sigma modulator 103 is 10 MHz. However, the frequencies at respective parts are not limited to them. This invention is applicable to other frequency bands.

The invention claimed is:

1. A radio apparatus comprising:
   a baseband signal generator to generate a baseband signal;
   a sine wave substituting device to substitute a transition part of the baseband signal having a logic level switching from "0" to "1" or "1" to "0" with a multivalue signal of a sine wave;
   a delta sigma modulator to modulate the multivalue signal into a binary signal;
   a carrier wave generator to generate a carrier wave; and
   a carrier wave modulator to modulate the carrier wave with the binary signal of the delta sigma modulator;
   a power amplifier to amplify a transmission signal from the carrier wave modulator;
   a band-pass filter to band-limit the amplified transmission signal; and
   an antenna to output the band-limited transmission signal from the band-pass filter as a radio wave.

2. The radio apparatus according to claim 1, wherein the carrier wave modulator modulates the carrier wave in a Binary Phase Shift Keying modulation method.

3. The radio apparatus according to claim 1, wherein the baseband signal generator, the sine wave substituting device, and the delta sigma modulator are digital circuits.

4. The radio apparatus according to claim 1, wherein the baseband signal generator, the sine wave substituting device, and the delta sigma modulator are installed in a Field Programmable Gate Array.

5. A radio apparatus comprising:
   a baseband signal generator to generate a baseband signal;
   a transition part substituting device to substitute a transition part of the baseband signal having a logic level switching from "0" to "1" or "1" to "0" with a multivalue sigmoid function;
   a delta sigma modulator to modulate the multivalue signal into a binary signal;
   a carrier wave generator to generate a carrier wave;
   a carrier wave modulator to modulate the carrier wave with the binary signal of the delta sigma modulator;
   a power amplifier to amplify a transmission signal from the carrier wave modulator;
   a band-pass filter to band-pass the amplified transmission signal; and
   an antenna to output the band-limited transmission signal from the band-pass filter as a radio wave.

6. The radio apparatus according to claim 5, wherein the carrier wave modulator modulates the carrier wave in a Binary Phase Shift Keying modulation method.

7. The radio apparatus according to claim 5, wherein the baseband signal generator, the transition part substituting device, and the delta sigma modulator are digital circuits.

8. The radio apparatus according to claim 5, wherein the baseband signal generator, the sine wave substituting device, and the delta sigma modulator are installed in a Field Programmable Gate Array.

9. A radio apparatus comprising:
   a baseband signal generator to generate a baseband signal;
   a sine wave substituting device to substitute a transition part of the baseband signal in which a logic level switches from "0" to "1" or "1" to "0" with a multivalue signal of sine wave;
   a carrier wave modulator to generate a carrier wave and modulate the carrier wave with the baseband signal outputted by the sine wave substituting device;
   a delta sigma modulator to modulate an output signal from the carrier wave modulator into a binary signal;
   a power amplifier to amplify a transmission signal from the delta sigma modulator;
   a band-pass filter to band-limit the amplified transmission signal; and
   an antenna to output the band-limited transmission signal from the band-pass filter as a radio wave.

10. The radio apparatus according to claim 9, wherein the baseband signal generator, the sine wave substituting device, the carrier wave modulator, and the delta sigma modulator are installed in a Field Programmable Gate Array.

11. The radio apparatus according to claim 9, wherein the carrier wave modulator modulates the carrier wave in a Binary Phase Shift Keying modulation method.

12. The radio apparatus according to claim 9, wherein the baseband signal generator, the sine wave substituting device, and the delta sigma modulator are digital circuits.

13. A radio apparatus comprising:
   a baseband signal generator to generate a first baseband signal and a second baseband signal;
   a first sine wave substituting device to substitute a transition part of the first baseband signal having a logic level switching from "0" to "1" or "1" to "0" with a first multivalue signal of a sine wave;
   a first delta sigma modulator to modulate the first multivalue signal into a first binary signal;
   a first carrier wave generator to generate a first carrier wave; and a first carrier wave modulator to modulate the first carrier wave with the first binary signal of the first delta sigma modulator;

a second sine wave substituting device to substitute a transition part of the second baseband signal having a logic level switching from "0" to "1" or "1" to "0" with a second multivalue signal of a sine wave;

a second delta sigma modulator to modulate the second multivalue signal into a second binary signal;

a second carrier wave generator to generate a second carrier wave; and a second carrier wave modulator to modulate the second carrier wave with the second binary signal of the second delta sigma modulator;

an adder to synthesize a modulated carrier wave from a first transmission signal from the first carrier wave modulator and a second transmission signal from the second carrier wave modulator;

a power amplifier to amplify the modulated carrier wave from the adder;

a band-pass filter to band-limit an amplified transmission signal from the power amplifier; and an antenna to output the band-limited transmission signal from the band-pass filter as a radio wave.

14. The radio apparatus according to claim 13, wherein the baseband signal generator, the first sine wave substituting device, the second sine wave substituting device, the first delta sigma modulator and the second delta sigma modulator are installed in a Field Programmable Gate Array.

15. The radio apparatus according to claim 13, wherein the first baseband signal and the second baseband signal correspond to an I-phase signal and a Q-phase signal in a Quadrature Phase Shift Keying modulation method.

16. The radio apparatus according to claim 13, wherein the baseband signal generator, the first sine wave substituting device, the second sine wave substituting device, the first delta sigma modulator and the second delta sigma modulator are digital circuits.

* * * * *